US012591632B1

(12) United States Patent　　　　(10) Patent No.:　US 12,591,632 B1

Pinto et al.　　　　　　　　　　　　(45) Date of Patent:　　Mar. 31, 2026

(54) AUTOMATE HARDWARE DESIGN USING RECURSION IN NON-POWER OF TWO FAST FOURIER TRANSFORM (FFT) HARDWARE ALGORITHMS

(71) Applicant: Amazon Technologies, Inc., Seattle, WA (US)

(72) Inventors: Ryan Pinto, Poway, CA (US); Ali M. Ficici, San Diego, CA (US); Jinkyu Choi, Sammamish, WA (US); Yi Tang, Issaquah, WA (US)

(73) Assignee: Amazon Technologies, Inc., Seattle, WA (US)

( * ) Notice: Subject to any disclaimer, the term of this patent is extended or adjusted under 35 U.S.C. 154(b) by 865 days.

(21) Appl. No.: 17/849,435

(22) Filed: Jun. 24, 2022

(51) Int. Cl.
　　*G06F 17/14*　　　(2006.01)
　　*G06F 7/49*　　　(2006.01)
　　*G06F 30/327*　　(2020.01)

(52) U.S. Cl.
　　CPC .......... *G06F 17/142* (2013.01); *G06F 30/327* (2020.01); *G06F 7/49* (2013.01)

(58) Field of Classification Search
　　CPC ... G06F 8/41; G06F 8/44; G06F 8/443; G06F 17/14–142; G06F 30/30; G06F 30/32–327; G06F 30/33; G06F 30/34–347; G06F 30/39
　　See application file for complete search history.

(56) References Cited

U.S. PATENT DOCUMENTS

| | | | |
|---|---|---|---|
| 9,582,473 B1 * | 2/2017 | Gal-On | G06F 9/30032 |
| 2008/0126026 A1 * | 5/2008 | Lee | G06F 17/142 |
| | | | 703/2 |

OTHER PUBLICATIONS

González-Concejero, C., et al. "A portable hardware design of a FFT algorithm." Latin American applied research 37.1 (2007): 79-82. (Year: 2007).*

* cited by examiner

*Primary Examiner* — Matthew D Sandifer

(74) *Attorney, Agent, or Firm* — Kilpatrick Townsend & Stockton LLP

(57)　　　　ABSTRACT

Technologies for compilers that implement non-power of two Fast Fourier Transform (FFT) algorithms are described. The non-power of two FFT algorithm uses a recursive function to generate a hardware design of a set of compute blocks of a fixed-point digital signal processor (DSP) and routing data between the compute blocks. The compiler receives input specifying a sequence of indexes and a bit width of the fixed-point DSP and performs a process. The process splits the sequence using a recursive loop, determines a number of multiplications in the hardware design, and generates a trace graph of the non-power of two FFT algorithm. The process is entered via the recursive function and exists when the recursive loop decrements to a specified value corresponding to a Radix-3 or Radix-2. The compiler outputs data, including the hardware design, the number of multiplications in the hardware design, and the trace graph.

20 Claims, 12 Drawing Sheets

100

104

SYNTHESIS COMPILER (WITH NON-POWER OF 2 FFT ALGORITHM) 106

HARDWARE DESIGN 108

TRACE GRAPH 110

PROCESSING DEVICE 102

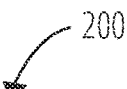

200

RECEIVE, AT A SYNTHESIS COMPILER THAT IMPLEMENTS A NON-POWER OF TWO FAST FOURIER TRANSFORM (FFT) ALGORITHM USING A RECURSIVE FUNCTION, INPUT SPECIFYING A SEQUENCE OF INDEXES AND A BIT WIDTH OF A FIXED-POINT DIGITAL SIGNAL PROCESSOR (DSP) 202

PERFORM A PROCESS THAT SPLITS THE SEQUENCE USING A RECURSIVE LOOP, WHEREIN THE PROCESS DETERMINES A NUMBER OF MULTIPLICATIONS IN A HARDWARE DESIGN OF A PLURALITY OF COMPUTE BLOCKS OF THE FIXED-POINT DSP, DETERMINES A NUMBER OF FFT POINTS, IDENTIFIES OPERATIONS FOR SERIALIZATION AT A FIRST RATE THAT IS GREATER THAN A CHANNEL RATE OF THE FIXED-POINT DSP, AND IDENTIFIES OPERATIONS FOR MATH OPTIMIZATIONS, AND GENERATES A TRACE GRAPH OF THE NON-POWER OF TWO FFT ALGORITHM, WHEREIN THE PROCESS USES THE RECURSIVE FUNCTION AND ENDS WHEN THE RECURSIVE LOOP DECREMENTS TO A VALUE CORRESPONDING TO A RADIX-3 OR RADIX-2 204

OUTPUT DATA COMPRISING THE HARDWARE DESIGN, THE NUMBER OF MULTIPLICATIONS IN THE HARDWARE DESIGN, AND THE TRACE GRAPH 206

FIG. 2A

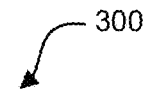
300

```
function [X_F2, nMult] = fft_split(x, N, str)                    302 str = str + "           ";
    fprintf("\n%sRecursive loop %d ", str, N);                   304 x1 = x(1:2:length(x));
    x2 = x(2:2:length(x));                                       306 if(N == 4)
        [X_F_1, nMult1] = fft_routine(x1, N/2, str);
        [X_F_2, nMult2] = fft_routine(x2, N/2, str);            308 else
        if(N == 6)
            [X_F_1, nMult1] = fft_routine_opt2(x1, N/2, str);
            [X_F_2, nMult2] = fft_routine_opt2(x2, N/2, str);   310
        else
            [X_F_1, nMult1] = fft_split(x1, N/2, str);
            [X_F_2, nMult2] = fft_split(x2, N/2, str);          312
            X_F2 = zeros(1,N);
        end
    end                                          314
    nMult = nMult1 + nMult2;          316
    Wn = exp ((-1)*1*j*2*pi/N);
    for k = 1:N/2
        X_F2(k)       = X_F_1(k) + Wn^(k-1*X_F_2(k);           318
        X_F2(k+N/2)   = X_F_1(k) – Wn^(k-1)*X_F_2(k);
        nMult         = nMult + 2;
    end
        fprintf("\n");               320
end
```

| $1 + i0$ | $1 + i0$ | $1 + i0$ |
|----------|----------|----------|
| $1 + i0$ | $-0.5 - i * \frac{\sqrt{3}}{2}$ | $-0.5 + i * \frac{\sqrt{3}}{2}$ |
| $1 + i0$ | $-0.5 + i * \frac{\sqrt{3}}{2}$ | $-0.5 - i * \frac{\sqrt{3}}{2}$ |

504

506

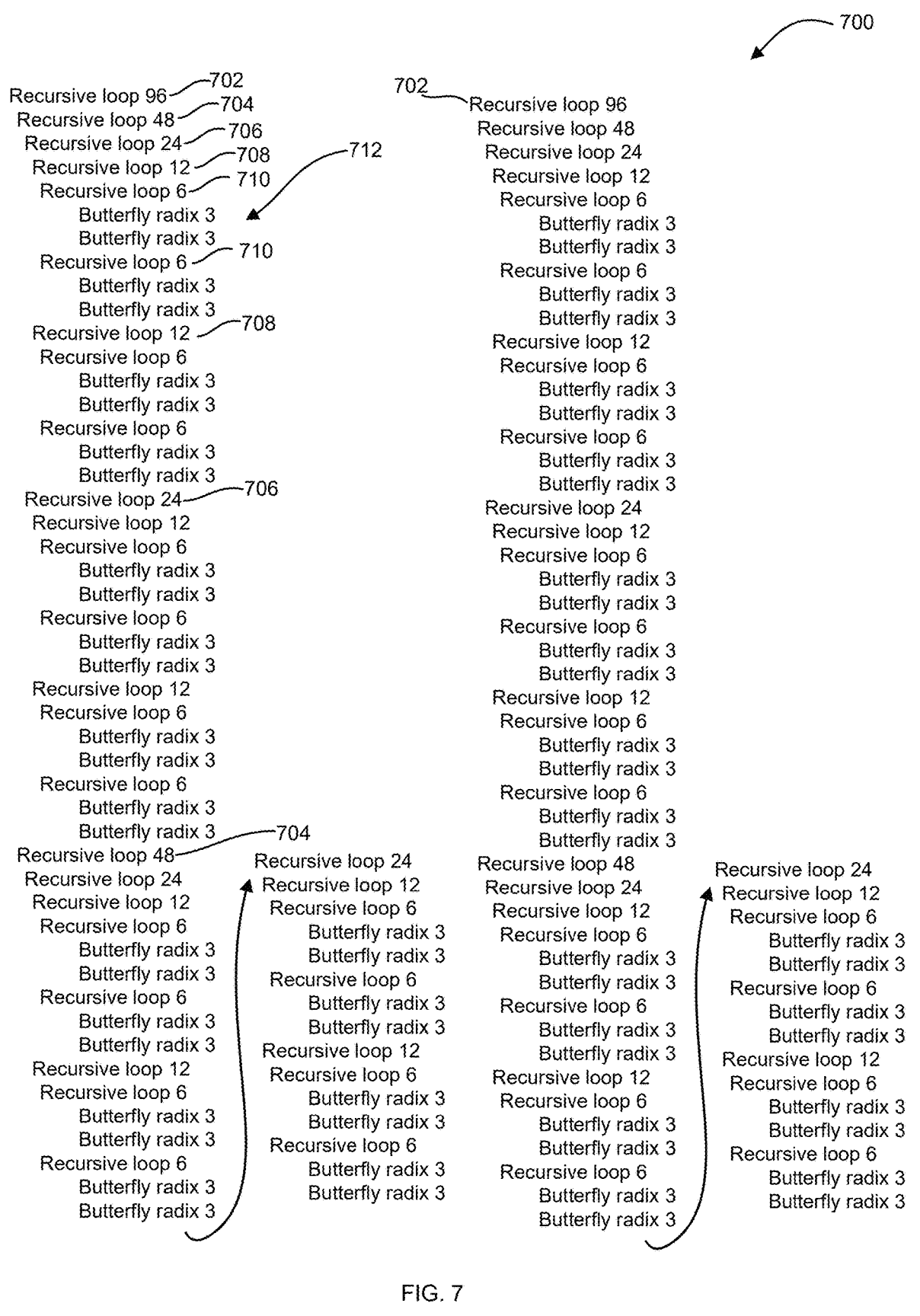

700

Recursive loop 96 — 702
Recursive loop 48 — 704
Recursive loop 24 — 706
Recursive loop 12 — 708
Recursive loop 6 — 710
    Butterfly radix 3
    Butterfly radix 3 — 710
Recursive loop 6 — 712
    Butterfly radix 3
    Butterfly radix 3
Recursive loop 12 — 708
Recursive loop 6
    Butterfly radix 3
    Butterfly radix 3
Recursive loop 6
    Butterfly radix 3
    Butterfly radix 3
Recursive loop 24 — 706
Recursive loop 12
Recursive loop 6
    Butterfly radix 3
    Butterfly radix 3
Recursive loop 6
    Butterfly radix 3
    Butterfly radix 3
Recursive loop 12
Recursive loop 6
    Butterfly radix 3
    Butterfly radix 3
Recursive loop 6
    Butterfly radix 3
    Butterfly radix 3 — 704
Recursive loop 48
Recursive loop 24
Recursive loop 12
Recursive loop 6
    Butterfly radix 3
    Butterfly radix 3
Recursive loop 6
    Butterfly radix 3
    Butterfly radix 3
Recursive loop 12
Recursive loop 6
    Butterfly radix 3
    Butterfly radix 3
Recursive loop 6
    Butterfly radix 3
    Butterfly radix 3

Recursive loop 24
Recursive loop 12
Recursive loop 6
    Butterfly radix 3
    Butterfly radix 3
Recursive loop 6
    Butterfly radix 3
    Butterfly radix 3
Recursive loop 12
Recursive loop 6
    Butterfly radix 3
    Butterfly radix 3
Recursive loop 6
    Butterfly radix 3
    Butterfly radix 3

702
Recursive loop 96
Recursive loop 48
Recursive loop 24
Recursive loop 12
Recursive loop 6
    Butterfly radix 3
    Butterfly radix 3
Recursive loop 6
    Butterfly radix 3
    Butterfly radix 3
Recursive loop 12
Recursive loop 6
    Butterfly radix 3
    Butterfly radix 3
Recursive loop 6
    Butterfly radix 3
    Butterfly radix 3
Recursive loop 24
Recursive loop 12
Recursive loop 6
    Butterfly radix 3
    Butterfly radix 3
Recursive loop 6
    Butterfly radix 3
    Butterfly radix 3
Recursive loop 12
Recursive loop 6
    Butterfly radix 3
    Butterfly radix 3
Recursive loop 6
    Butterfly radix 3
    Butterfly radix 3
Recursive loop 48
Recursive loop 24
Recursive loop 12
Recursive loop 6
    Butterfly radix 3
    Butterfly radix 3
Recursive loop 6
    Butterfly radix 3
    Butterfly radix 3
Recursive loop 12
Recursive loop 6
    Butterfly radix 3
    Butterfly radix 3
Recursive loop 6
    Butterfly radix 3
    Butterfly radix 3

Recursive loop 24
Recursive loop 12
Recursive loop 6
    Butterfly radix 3
    Butterfly radix 3
Recursive loop 6
    Butterfly radix 3
    Butterfly radix 3
Recursive loop 12
Recursive loop 6
    Butterfly radix 3
    Butterfly radix 3
Recursive loop 6
    Butterfly radix 3
    Butterfly radix 3

FIG. 7

AUTOMATE HARDWARE DESIGN USING RECURSION IN NON-POWER OF TWO FAST FOURIER TRANSFORM (FFT) HARDWARE ALGORITHMS

BACKGROUND

A large and growing population of users is enjoying entertainment through the consumption of digital media items, such as music, movies, images, electronic books, and so on. The users employ various electronic devices to consume such media items. Among these electronic devices (referred to herein as user devices) are electronic book readers, cellular telephones, personal digital assistants (PDAs), portable media players, tablet computers, netbooks, laptops, and the like. These electronic devices wirelessly communicate with a communications infrastructure to enable the consumption of digital media items. In order to wirelessly communicate with other devices, these electronic devices include one or more antennas.

BRIEF DESCRIPTION OF THE SEVERAL VIEWS OF THE DRAWINGS

The present embodiments will be understood more fully from the detailed description given below and from the accompanying drawings of the present disclosure, which, however, should not be taken to limit the present embodiments, but are for explanation and understanding only.

FIG. 2A is a flow diagram of a method of generating a non-power of two FFT hardware architecture using an FFT hardware algorithm using recursion, according to at least one embodiment.

FIG. 3 illustrates an example code of an FFT Hardware algorithm with a decimation-in-time FFT (DITFFT) process, according to at least one embodiment.

FIG. 7 illustrates an example trace graph of an FFT hardware architecture, according to at least one embodiment.

DETAILED DESCRIPTION

Figure 1:
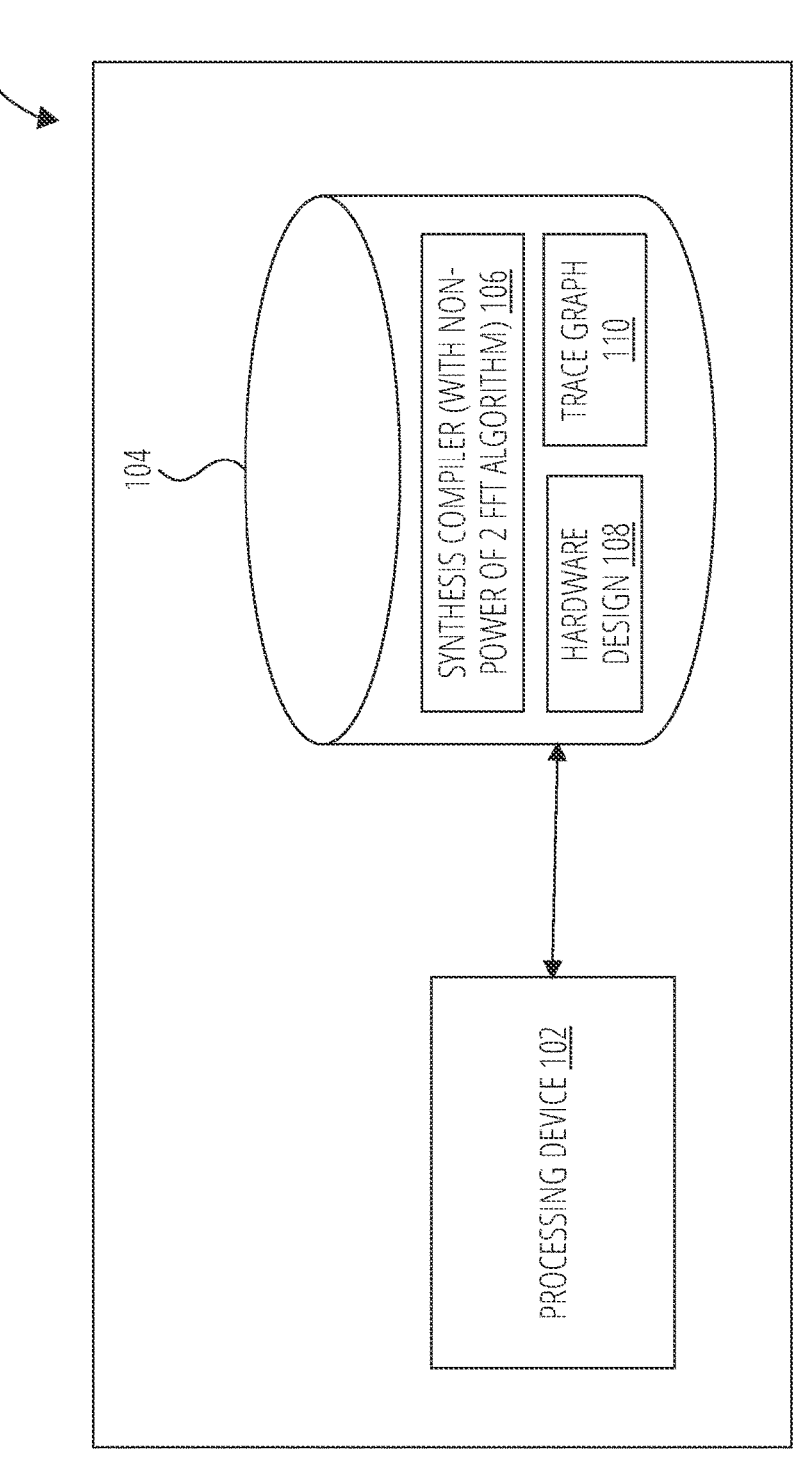
FIG. 1 is a block diagram of a computing system including a synthesis compiler for generating a non-power of two FFT hardware architecture using recursion, according to at least one embodiment.

Technologies for synthesis compilers that implement non-power of two Fast Fourier Transform (FFT) algorithms are described. In certain engineering applications, it is necessary to have a non-power of two FFT. Literature has proposed various butterfly topologies with an optimum number of hardware blocks to solve this problem. Drawing out the intermediate stages of the butterfly blocks and wiring them can be tedious and prone to error, compounding the verification problem. High-level synthesis compliers (HLS) exist to produce hardware designs based on mathematical formulations of algorithms. A synthesis compiler provides high-level synthesis that allows hardware designers to build and verify the hardware efficiently. High-level synthesis is an automated design process that takes an abstract behavioral specification of a digital system and determines a register-transfer level (RTL) structure that realizes the given behavior. There are very few industry-standard HLS tools to solve non-power of two FFTs. Most of these HLS implementations suffer from not being able to perform multi-sample per clock parallelized versions. The parallelization factor can be arbitrary and clock rate dependent. In field-programmable gate arrays (FPGA), the compute clock speed is significantly lower than the application-specific integrated circuit (ASIC) speed.

Another approach to perform computations that are resource shared is to use a faster clock as an inner loop clock. However, conventional HLS algorithms do not have this mechanism for many architectures.

Aspects and embodiments of the present disclosure overcome the deficiencies described above and others by providing a non-power of two FFT algorithm that uses recursion to automate a design of compute blocks and routing between compute blocks. Compute blocks are circuits, logic, or hardware units that can multiply, accumulate, or both, as described herein. The compute blocks can also handle other operations, such as split, shift, or the like. Aspects and embodiments of the present disclosure can determine which compute blocks can be resource shared and execute operations at a higher clock rate. There is a seamless handoff between operations performed at a first clock rate (slow clock) and operations performed at a second clock rate (fast clock) higher than the first clock rate. As clock rates increase, the butterfly operations may be stacked in time to further improve efficiency. Aspects and embodiments of the present disclosure can provide a non-power of two FFT algorithm that is parameterizable to work with any fixed-point digital signal processor (DSP) bit width. The bit width is a width of a fixed-point DSP. A sequence input into the fixed-point DSP has a same bit width as the fixed-point DSP. The non-power of two FFT algorithm can employ pipelining, and paths that do not enter the compute stages can be forwarded to the next stage to synchronize the process.

In at least one embodiment, the non-power of two FFT algorithm uses a recursive function to generate a hardware design of a set of compute blocks of a fixed-point DSP and routing data between the compute blocks. The synthesis compiler receives input specifying a sequence of indexes and a bit width of the fixed-point DSP and performs a process. The process splits the sequence using a recursive loop. The recursive loop determines a number of multiplications in the hardware design, determines a number of FFT points, identifies operations for serialization at a first rate that is greater than a channel rate of the fixed-point DSP (e.g., serialized multiplications at a faster clock within the compute block), and identifies operations for math optimizations (e.g., trigonometric calculations, pre-computed scalers, sign flips, etc.), and generates a trace graph of the non-power of two FFT algorithm. The hardware design includes a compute block that can perform serialized operations at a faster rate than non-serialized operations. There can be seamless transitions between the faster and slower clocked operations. A trace graph is an output file produced by the synthesis compiler that can be used by a hardware design to build and validate a hardware design. A trace graph is an output of a function trace of the algorithm. The trace graph can be used to map to an addressing scheme for the hardware design. The process is entered via the recursive function and exists when the recursive loop decrements to a specified value corresponding to a Radix-3 or Radix-2. That is, the process uses the recursive function and the process ends when the recursive loop decrements to a value corresponding to the Radix-3 or Radix-2. The process can include other Radixes, such as Radix-4, and so on. Radix-2 FFT refers to an FFT algorithm that recursively divides a DFT into two half-length DFTs of the even-sequence and odd-sequences of time samples in decimation-in-time FFTs and frequency samples in decimation-in-frequency FFTs. Radix-3 FFT refers to an FFT algorithm that recursively divides a DFT into two half-length DFTs of the even-sequence and odd-sequences of time samples in decimation-in-time FFTs and frequency samples in decimation-in-frequency FFTs and performs 3-point butterfly operations. The synthesis compiler outputs data, including at least the number of multiplications in the hardware design, the number of FFT points, and the trace graph. The synthesis compiler can output other data regarding the hardware design and routing data used for an addressing scheme.

FIG. 1 is a block diagram of a computing system 100 including a synthesis compiler 106 for generating a non-power of two FFT hardware architecture using recursion, according to at least one embodiment. The computing system 100 includes a processing device 102 and a memory device 104. The computing system 100 can include other components, including network interfaces, one or more radios, storage devices, input-output devices, or the like. The processing device 102 can be any type of processing device that can implement operations associated with synthesis compiler 106, as described in more detail below. In at least one embodiment, the synthesis compiler 106 is instructions stored in the memory device 104 that, when executed by the processing device 102, perform the operations of a non-power of two FFT algorithm with a recursive function, as described herein. In at least one embodiment, the synthesis compiler 106 is implemented in a computing system used to design FFT hardware architectures, such as a fixed-point digital signal processor (DSP). In at least one embodiment, the synthesis compiler 106 implements a non-power of two FFT algorithm using a recursive function to generate a hardware design of a set of compute blocks of a fixed-point DSP and routing data between the set of compute blocks. In at least one embodiment, the fixed-point DSP is used in a wireless device to process radio frequency (RF) signals. In at least one embodiment, the synthesis compiler 106 can receive input specifying a sequence of indexes and a bit width of a fixed-point DSP. The synthesis compiler 106 performs a process (e.g., a decimation-in-time FFT (DITFFT) process or a decimation-in-frequency FFT (DIF-FFT) process) that splits the sequence using a recursive loop. Decimation-in-time FFT is an operation to recursively partition a DFT into two half-length DFTS of the even-indexes and odd-indexed time samples. The outputs of these shorter FFTs are reused to compute many outputs. Decimation-in-frequency FFT is a flow-graph reversal of the decimation-in-time FFT. The DIFFFT has the same twiddle factors in a reverse pattern, the same operation counts, and the output is in a bit-reversed order. Twiddle factors, in FFT algorithms, are trigonometric constant coefficients that are multiplied by data in the course of the algorithm. The process is entered via the recursive function and exists when the recursive loop decrements to a specified value corresponding to a Radix-3 or Radix-2, as described herein. The synthesis compiler 106 determines a hardware design 108 and a number of multiplications in the hardware design 108. The hardware design 108 can include the FFT hardware architecture 400, as described below with respect to FIG. 4. The hardware design 108 can be an FFT circuit or a non-power of two FFT circuit. The synthesis compiler 106 can determine a number of multiplications in a hardware design of a set of compute blocks of the fixed-point DSP and a number of FFT points. The synthesis compiler 106 can identify operations for serialization at a first rate that is greater than a channel rate of the fixed-point DSP. The synthesis compiler 106 can identify operations for math optimizations (e.g., trigonometric calculations, pre-scaler calculations, sign flips, etc.). The synthesis compiler 106 generates a trace graph 110 of the non-power of two FFT algorithm. The trace graph 110 contains routing data that indicates how the compute blocks are connected in the hardware design 108. The synthesis compiler 106 outputs data including the hardware design 108, the number of multiplications in the hardware design 108, and the trace graph 110.

In the synthesis compiler 106, the non-power of two FFT algorithm uses resource sharing of a compute block of the set of compute blocks and time-sharing a number of multiplications within the compute block. The non-power of two FFT algorithm can identify a number of multiplications (and additions) of the operations for serialization to be performed at the faster rate within the compute block. Additional details of the non-power of two FFT algorithms are described below regarding FIG. 2B to FIG. 7. The compute block is illustrated and described below with respect to FIG. 6.

In various embodiments, the computing system 100 can generate an FFT hardware architecture used in a communication system of a device, such as a satellite, a user terminal, a ground station, or the like. The device with the FFT hardware architecture may include memory, storage, one or more wired communication interfaces, two or more wireless communication interfaces, one or more processing devices, or the like. The communication interface, which may include one or more network devices for connecting to the Internet, may be adapted to wirelessly couple the device with the FFT hardware architecture to one or more network devices of a first network. The processing device can process various data, including, for example, topology information, such as node location, historical interference event data (e.g., which devices detected interference events on which channels), historical data transfer rate requirements (e.g., from applications on the client wireless devices), historical application-based throughput and latency requirements (e.g., by content streaming applications of the client wireless devices over particular channels), per-channel antenna configurations, and channel congestion data associated with particular channels on which the multiple wireless devices communicate. The data may further include information associated with, or useable to determine, pattern recognition and learning associated with radar event detection, data bandwidth requirements, latency requirements, and the like. The data may also include scan lists, proximity data, dynamic frequency selection (DFS) channels, requirement sets, or the like.

The device with the FFT hardware architecture can communicate with other devices on a network. The network may be representative of an Internet or wide area network (WAN) connection. Such an Internet or WAN connection may include additional links or trunks, whether wired or wireless, that may involve other types of wideband communication, including those based on cellular standard(s).

In at least one embodiment, the device includes a phased array antenna with multiple antenna elements. In at least one embodiment, the phased array antenna can be a linear array with antenna elements organized in a one-dimensional array, such as a linear array with multiple elements arranged in an x-axis or a linear array with multiple elements arranged in a y-axis. In at least one embodiment, the phased array antenna can be a planar array with antenna elements organized in a two-dimensional array, such as a rectangular array, a triangular array, a circular array, or an array with custom grids. The device with the FFT hardware architecture also includes digital beam forming (DBF) circuitry. The DBF circuitry can be one or more circuits coupled to the antenna elements of the phased array antenna. The DBF circuitry can control a magnitude and a phase or delay of an excitation signal at each of the antenna elements to electronically steer a radiation beam of the phased array antenna. The processing device (or a dedicated processing device separate from a host processor) is coupled to the DBF circuitry. The device with the FFT hardware architecture includes one or more memory devices that store instructions that, when executed by the processing device, cause the processing device to perform various operations.

In at least one embodiment, the phased array antenna can include a first set of antenna elements located on a support structure. The support structure can be a circuit board, such as a printed circuit board (PCB), or other structures upon which the antenna elements can be positioned. The first set of antenna elements can be organized as a first lattice or grid, such as illustrated and described herein. It should be noted that a second phased array antenna can be located in a same aperture as the phased array antenna. For example, a second set of antenna elements can be co-located with the first set of antenna elements. The first grid can have a first inter-element spacing of a first distance, and the second grid can have a second inter-elements spacing of a second distance that is smaller than the first distance. The elements in the different sets can also have different sizes. The sizes and spacing can correspond to wavelengths associated with the respective frequency bands. The second grid can be rotated at a specified angle from the first grid. In at least one embodiment, the first set and/or the second set of antenna elements are constructed with multiple unit cells. Each unit cell can include different combinations of antenna elements to make up one or more phased array antennas. The phased array antenna can be coupled to a radio, including a baseband processor and radio frequency front-end (RFFE) circuitry. Alternatively, the phased array antenna can be coupled to other communication systems, such as RF radios, microwave radios, or other signal sources or receivers.

In at least one embodiment, the processing device can receive inputs, such as user input or input from an application, calculate array factor values using various techniques described in more detail below, and send the array factor values to the DBF circuitry to control the phased array antenna according to the array factor values. In at least one embodiment, the inputs include an azimuth angle value (theta or /) and an elevation angle value (phi or θ). For example, an application can determine a coordinate of the device with the FFT hardware architecture and a coordinate of another device, such as a satellite. The application can determine an angle for the device with the FFT hardware architecture to communicate with the satellite, and the processing device can receive this angle information as part of the inputs. The inputs can also include a value that specifies a distance between antenna elements. In the case of a linear array, a first value can specify a distance between two antenna elements in the linear array. In the case of a planar array, a first value can specify a first distance between two antenna elements in a first dimension, and a second value can specify a second distance between two antenna elements in a second dimension. The inputs can also include a value that specifies a wavelength associated with an operating frequency of the phased array antenna. The inputs can also include a value that specifies a sampling frequency. In the case of a linear array, a value can specify the sampling frequency in the one dimension of the linear array. In the case of a planar array, a first value can specify a first sampling frequency in a first dimension, and a second value can specify a second sampling frequency in a second dimension. In at least one embodiment, the inputs 111 can include a beam pattern, as noted by a main lobe or peak lobe and side lobes. The beam pattern can be a pattern mask that specifies the desired radiation beam and angle, and the processing device can calculate magnitudes and phase values to drive the antenna elements to achieve the desired radiation beam. The output can be a matrix of complex numbers. In at least one embodiment, the inputs can include a matrix of theta angle values and phi angle values and a corresponding magnitude at a given coordinate. The array factor can be a matrix or vector of elements containing a phase value and a magnitude value for each respective one of the plurality of antenna elements.

In at least one embodiment, the synthesis compiler 106 uses a non-power of two FFT algorithm with recursion that automates the wiring of the compute blocks. The wiring is abstracted by the recursion. The synthesis compiler 106 determines the routing and which compute blocks may be resource shared, and which operations can be executed at a higher clock rate with the shared resource. There can be a seamless handoff between operations performed at a first clock rate (slow clock) and operations performed at a second clock rate (fast clock) higher than the first clock rate. As clock rates increase, the butterfly operations may be stacked in time to further improve efficiency. The synthesis compiler 106 can parameterize the non-power of two FFT algorithms to work with any fixed-point DSP bit width. The synthesis compiler 106 can use the non-power of two FFT algorithm to define pipelines. The synthesis compiler 106 can use the non-power of two FFT algorithm to define paths that do not enter the compute stages to be forwarded to the next stage to keep the process synchronized.

In at least one embodiment, the synthesis compiler 106 can implement a non-power of two FFT algorithm with a recursive function to generate a hardware design 108 of a set of compute blocks of a fixed-point DSP and routing data between the set of compute blocks. The hardware design 108 can be part of an FFT circuit. The synthesis compiler 106 can call a recursive function with input that specifies a width of the fixed-point DSP and a sequence for the addressing scheme. The recursive function calls itself and exits when the recursion decrements to a smallest specified Radix (e.g., Radix-3) or to one of the multiple specified radixes (e.g., Radix-2, Radix-3, Radix-4, etc.). The recursive function splits the sequence into a first sub-sequence and a second sub-sequence in a first instance. The recursive function continues to splits the sequences until the specified condition is met in the recursion. The synthesis compiler 106 automates the wiring and addressing schemes of the compute blocks of a circuit using the recursive function. The synthesis compiler 106 can identify a first subset of a set of compute blocks of the fixed-point DSP to execute operations at a first clock rate and a second subset of the set of compute blocks of the fixed-point DSP to execute operations at a second clock rate slower than the first clock rate. The synthesis compiler 106 can determine routing data of the fixed-point DSP using recursion. The synthesis compiler 106 can determine the routing and which compute blocks can be resource shared to execute operations at the higher clock rate. The synthesis compiler 106 can provide a seamless handoff between slow and fast clocks. As clock rates increase, butterfly operations may be stacked to improve efficiency. The synthesis compiler 106 can work with any fixed-point DSP bit width. The synthesis compiler 106 can have multiple samples per clock for parallelized versions. HLS applications can use the synthesis compiler 106 to produce hardware designs 108 based on the mathematical formulations of the non-power of two FFT algorithms described herein. Additional details of the non-power of two FFT algorithm are described below with respect to FIG. 2A to FIG. 2B.

FIG. 2A is a flow diagram of a method 200 of generating a non-power of two FFT hardware architecture using recursion, according to at least one embodiment. The method 200 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 200 is performed by the computing system 100 of FIG. 1.

Referring to FIG. 2A, the method 200 begins by the processing logic receiving, at a synthesis compiler that implements a non-power of two FFT algorithm using a recursive function, input specifying a sequence of indexes, and a bit width of a fixed-point DSP (block 202). The processing logic performs a process that splits the sequence using a recursive loop, determines a number of multiplications in a hardware design of a plurality of compute blocks of the fixed-point DSP, and generates a trace graph of the non-power of two FFT algorithm (block 204). The process is entered via the recursive function and exists when the recursive loop decrements to a specified value corresponding to a Radix-3 or Radix-2. The processing logic outputs data comprising the hardware design, the number of multiplications in the hardware design, and the trace graph (block 206). In at least one embodiment, the processing logic generates first data representing a hardware design of a set of compute blocks of the fixed-point DSP and routing data representing wiring between the set of compute blocks.

In at least one embodiment, the process at block 204 is a DITFFT process. In another embodiment, the process at block 204 is a DIFFFT process. In a further embodiment, the non-power of two FFT algorithm uses resource sharing of a compute block of the set of compute blocks and time-sharing a number of multiplications within the compute block. In another embodiment, the set of compute blocks includes final leaf nodes. A final leaf node is a node with no children nodes. The final leaf nodes can perform complex-number multiplications using at least one of the three-multiply Karatsuba factorization method or the four-multiply method.

Figure 2B:
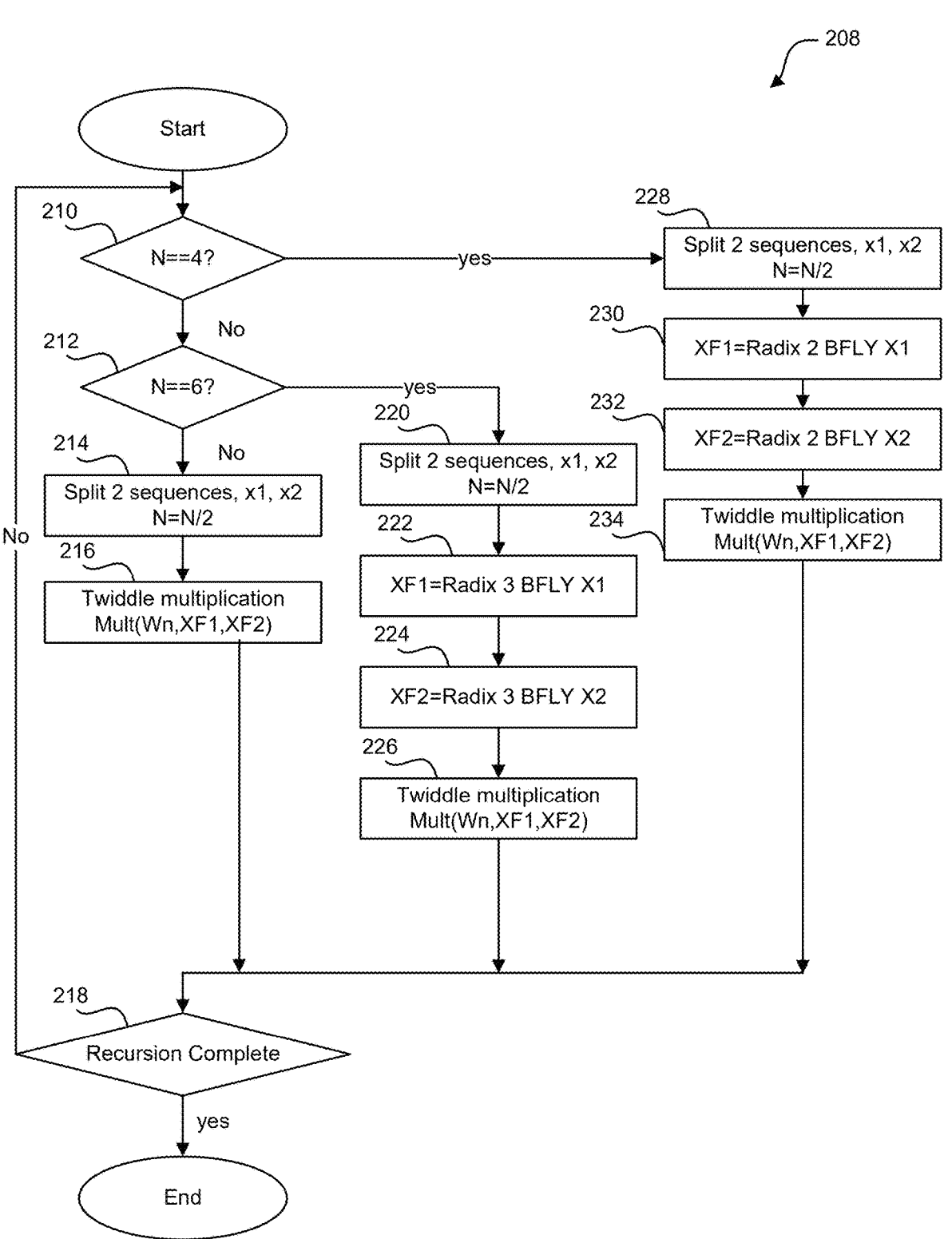
FIG. 2B is a flow diagram of a process entered by a recursive function of generating a non-power of two FFT hardware architecture using an FFT hardware algorithm using recursion, according to at least one embodiment.

FIG. 2B is a flow diagram of a method 208 of generating a non-power of two FFT hardware architecture using recursion, according to at least one embodiment. The method 208 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 208 is performed by the computing system 100 of FIG. 1. In at least one embodiment, the method 208 is the process performed at block 204 of FIG. 2A. In this embodiment, the bit width of a sequence equals N, where N is a positive integer value that is a non-power of two, such as 64, 128, 192, etc.

Referring to FIG. 2B, the method 208 begins with the processing logic determining if the bit width of the sequence, N, is equal to four corresponding to Radix-2 (block 210) or six corresponding to Radix-3 (block 212). In another embodiment, the processing logic can determine if N is equal to other values corresponding to other Radixes, such as Radix-4. When the method 208 is first instantiated, such as calling a recursive function, as illustrated in FIG. 3, N will not be equal to four at block 210 or six at block 212. The processing logic splits the sequence into a first sequence, x1, and a second sequence, x2, and divides N by two (block 214). The processing logic performs the twiddle factor multiplications for the complex-number multiplications (e.g., Mult(Wn, XF1, XF2)) (block 216). A twiddle factor, in FFT algorithms, is a trigonometric constant coefficient that is multiplied by data. The twiddle factors are also referred to as root-of-unity complex-number multiplicative constants in butterfly operations. The processing logic determines if the recursion is complete (block 218). The recursion loop is entered via the first call to the recursive function. The recursion loop is completed when the recursive loop decrements to a specified value corresponding to Radix-3 (e.g., N==6) or a specified value corresponding to Radix-2 (e.g., N==2). Similarly, when the method 208 is first instantiated, the recursion will not be complete and returns to block 210. The processing logic repeats blocks 210 to 218 until the recursive loop decrements to the specific value of 6 or 4.

When the recursive loop decrements to the specific value of 6 at block 212, the processing logic splits the sequence into a first sequence, x1, and a second sequence, x2, and divides N by two (block 220). The processing logic performs a first Radix-3 butterfly operation on the first sequence, x1, to obtain a first result, XF1 (block 222). The processing logic performs a second Radix-3 butterfly operation on the second sequence, x2, to obtain a second result, XF2 (block 224). The processing logic performs the twiddle factor multiplications for the complex-number multiplications (e.g., Mult (Wn, XF1, XF2)) (block 226). The processing logic determines that the recursion is complete at block 218, and the method 208 ends.

When the recursive loop decrements to the specific value of 4 at block 212, the processing logic splits the sequence into a first sequence, x1, and a second sequence, x2, and divides N by two (block 228). The processing logic performs a first Radix-2 butterfly operation on the first sequence, x1, to obtain a first result, XF1 (block 230). The processing logic performs a second Radix-2 butterfly operation on the second sequence, x2, to obtain a second result, XF2 (block 232). The processing logic performs the twiddle factor multiplications for the complex-number multiplications (e.g., Mult (Wn, XF1, XF2)) (block 234). The processing logic determines that the recursion is complete at block 218, and the method 208 ends.

The non-power of two FFT algorithm may use Radix-2 or Radix-3 butterfly operations and works for methods decimation-in-time (DIT) or decimation-in-frequency (DIF). The non-power of two FFT algorithm can use resource-sharing and time-sharing multiplications inside a computing butterfly node that performs the Radix-2 or Radix-3 butterfly operations. A computing butterfly node is a circuit, logic, block, or hardware unit that can handle the multiple butterfly operations. For example, a computing butterfly node can include a Radix-3 hardware block that performs the Radix-3 butterfly operations. The Radix-3 hardware block is a circuit, logic, block, or hardware unit that performs the 3-point butterfly operations described herein. The Radix-3 hardware block reduces nine complex-number multiplications into four multiplications. The Radix-3 hardware block uses arithmetic shifts, pre-computes scalers in the fixed point DSP, and negates for math optimizations. The final leaf nodes can employ arithmetic shifts to avoid multiplications. On the data side, the non-power of two FFT algorithm can use four building blocks, including a sequence splitter, a Radix-2 hardware block a Radix-3 hardware block, a Radix-2 hardware block, and a complex product summer. A complex product summer is a circuit, logic, block, or hardware unit that can take the sum of two or more complex values. The final leaf nodes can perform complex-number multiplications using the 3 multiply Karatsuba factorization or the regular 4 multiply method. On the coefficient side, the non-power of two FFT algorithm uses pre-computed twiddle factors. The non-power of two FFT algorithm can achieve reduced multiplications and additions and lends itself well to hardware code generation, which speeds up design and verification efforts.

The non-power of two FFT algorithm is described below using a DITFFT process as described below with respect to FIG. 3. As described above, the process is entered via a recursive function and exits when the recursive loop decrements to either three, in the case of Radix-3, or two, in the case of Radix-2.

FIG. 3 illustrates an example code 300 of an FFT hardware algorithm with a DITFFT process, according to at least one embodiment. The example code 300 defines a recursive function 302 with three parameters: a sequence, x, a bit width of the sequence, N, and a string type. The recursive function 302 returns a result vector, X_F2, of the FFT algorithm, and a number of multiplications of the FFT algorithm. The recursive function 302 includes operations 304 to define a string, "Recursive Loop" with a current value for N, and prints the string and N to a file to create a trace graph, such as trace graph 700 of FIG. 7, where N is equal to 192. The recursive function 302 includes operations 306 to split the sequence into a first sequence, x1, and a second sequence, x2. In this example, the FFT hardware algorithm decimates in time by alternating between odd and even samples. For decimation-in-frequency, the split operations can split the sequence as a first set of samples and then a second set of samples according to frequency. The recursive function 302 includes operations 308 to perform the Radix-2 butterfly operations for the first sequence and the second sequence. The operations 308 are only performed when N equals 4, corresponding to Radix-2. The recursive function 302 includes operations 310 to perform the Radix-3 butterfly operations for the first sequence and the second sequence. The operations 310 are only performed when N equals 6, corresponding to Radix-3. As described herein, the Radix-3 butterfly operations can use Radix-3 math optimizations to further reduce the multiplications needed. If N is not equal to 4 or 6, the recursive function 302 includes operations 312 to further split the sequence by calling the recursive function 302 for the first sequence and the second sequence. The operations 312 can also initialize the result vector, X_F2, with zeros.

The recursive function 302 includes operation 314 to determine a total count of multiplications, nMult, by adding a first number of multiplications needed for the first sequence and a second number of multiplications needed for the second sequence. The recursive function 302 includes operation 316 to compute a twiddle factor, Wn, by computing the following equation (1):

$$Wn=\exp((-1)*1*j*2*pi/N) \tag{1}$$

The recursive function 302 includes operations 318 to compute the complex-number multiplications, as set forth in the following equations (2) and (3):

$$X\_F2(k)=X\_F\_1(k)+Wn^{\wedge}(k-1)*X\_F\_2(k) \tag{2}$$

$$X\_F2(k+N/2)=X\_F\_1(k)-Wn^{\wedge}(k-1)*X\_F\_2(k) \tag{2}$$

The operations 318 can increment the total count of multiplications by two for the two complex-number multiplications (e.g., nMult=nMult+2). The recursive function 302 includes an operation 320 to print to the file a new line before the next instance of the recursive function 302. As described herein, the recursive function 302 produces a trace graph, such as illustrated in the trace graph 700 of FIG. 7, where N is equal to 192. By nature of the recursion, the trace graph defines a routing or addressing scheme for the compute blocks. The trace graph can include the routing data for the different recursion levels, such as printed to the file by the recursive function 302. The recursive function 302 can be used to generate an FFT hardware architecture, such as illustrated and described below with respect to FIG. 4.

Figure 4:
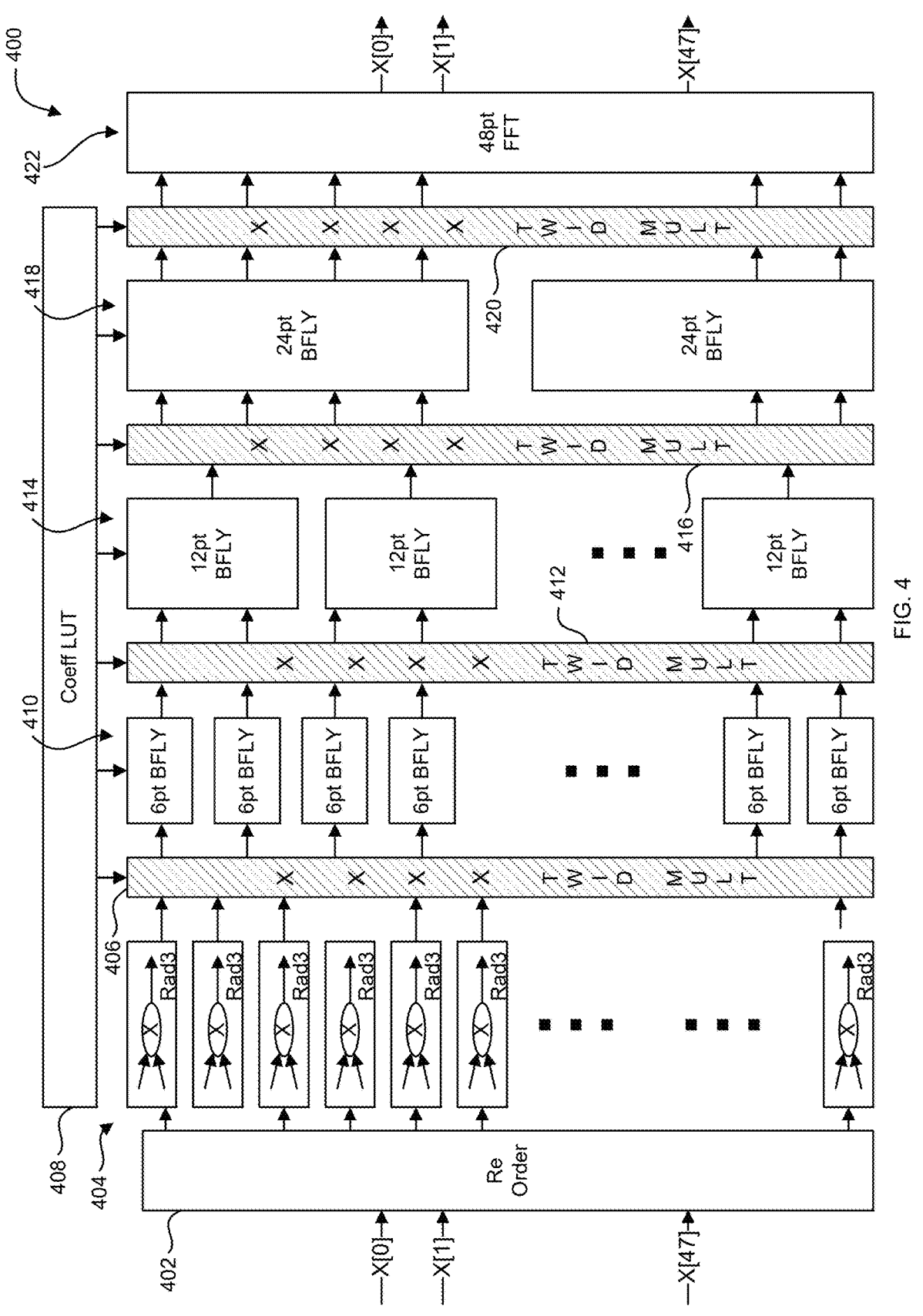
FIG. 4 is a block diagram of an FFT hardware architecture generated by the synthesis compiler, according to at least one embodiment.

FIG. 4 is a block diagram of an FFT hardware architecture 400 generated by the synthesis compiler, according to at least one embodiment. The device with the FFT hardware architecture 400 is illustrated for a bit width of 48 bits for ease of description. The device with the FFT hardware architecture 400 can be generated for other bit widths as described herein. The device with the FFT hardware architecture 400 includes reorder logic 402 that receives an input sequence, x[0]-x[47], and routes the input sequence to a set of Radix-3 butterfly nodes 404. The set of Radix-3 butterfly nodes 404 is coupled to twiddle factor multiplication node 406. The twiddle factor multiplication node 406 can receive coefficients from a coefficient look-up table (LUT) 408. The twiddle factor multiplication node 406 is coupled to a set of 6-pt butterfly nodes 410. The 6-pt butterfly nodes 410 are coupled to twiddle factor multiplication node 412 and can also receive coefficients from the coefficient LUT 408. The twiddle factor multiplication node 412 is coupled to a set of 12-pt butterfly nodes 414. The 12-pt butterfly nodes 414 are coupled to twiddle factor multiplication node 416 and can also receive coefficients from the coefficient LUT 408. The twiddle factor multiplication node 416 is coupled to a set of 24-pt butterfly nodes 418. The 24-pt butterfly nodes 418 are coupled to twiddle factor multiplication node 420 and can also receive coefficients from the coefficient LUT 408. The twiddle factor multiplication node 420 is coupled to a 48-pt butterfly node 422. The 48-pt butterfly node 422 outputs a result, X[0]-X[47]. As described herein, other FFT hardware architectures can be generated for other bit widths than 48. Also, the Radix-3 butterfly nodes 404 can use some math optimizations to further reduce the number of multiplications for the device with the FFT hardware architecture 400, such as described below with respect to FIG. 5A-5B.

Figures 5A, 5B:
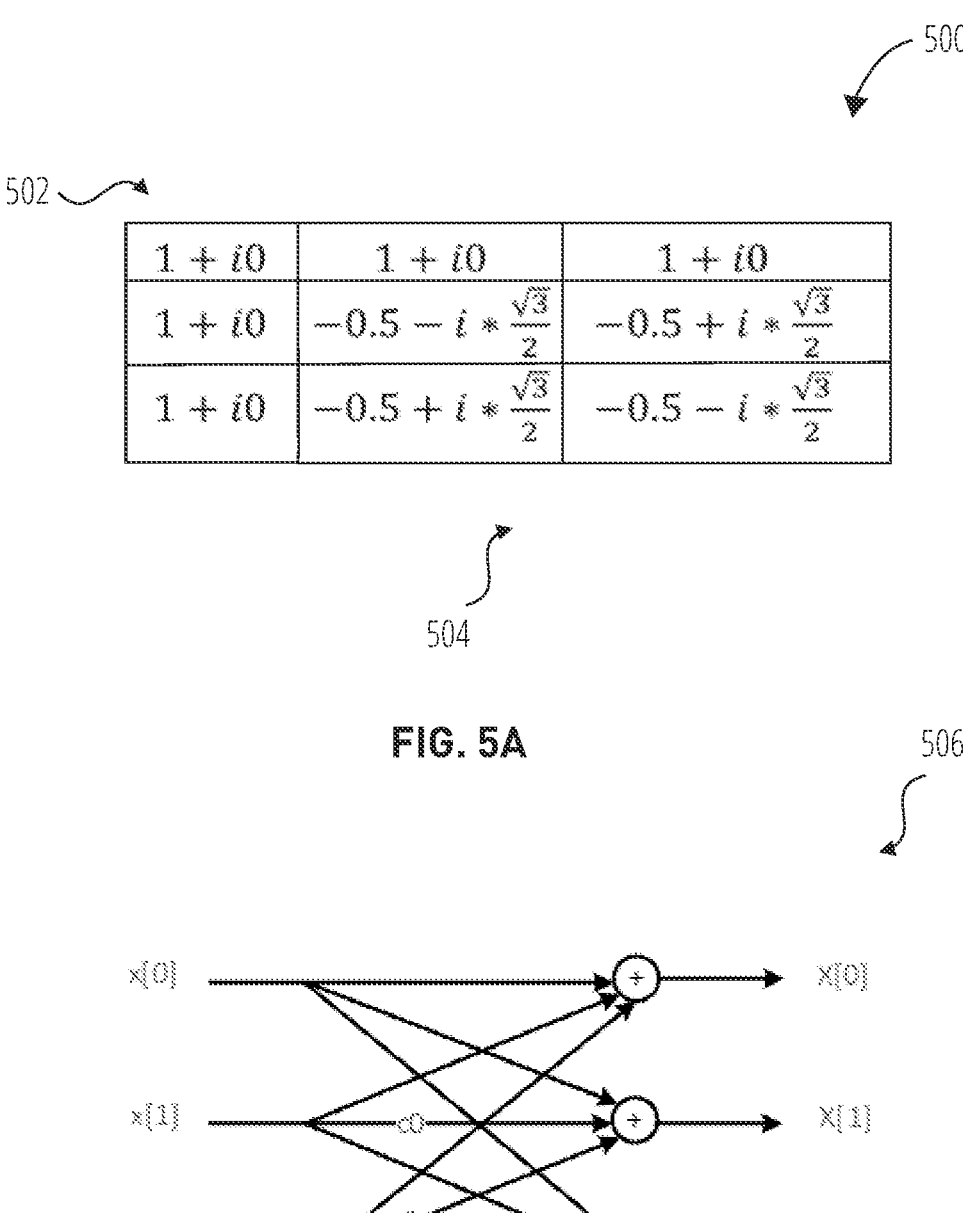
FIG. 5A is a matrix of Radix-3 math optimizations that can reduce to four multiplications, according to at least one embodiment.
FIG. 5B is a diagram illustrating a Radix-3 FFT, according to at least one embodiment.

FIG. 5A is a matrix 500 of Radix-3 math optimizations that can reduce to four multiplications, according to at least one embodiment. The Radix-3 butterfly nodes 404 each performs nine calculations, as illustrated in the matrix 500. As illustrated in the matrix 500, five operations 502 do not require multiplication since the values are 1 (e.g., 1+i0=1), leaving four operations 504 with multiplications. Operations 504 are similar multiplications apart from the signs. The Radix-3 math optimizations can include performing shifts for the 0.5 and negating the values as needed to accommodate the different signs. This can be done using 2's complements. The Radix-3 math optimizations can include computing the constant sqrt(3)/2 in fixed point and negating as needed. As such, the 9×2 complex-number multiplications (one for each of the two sequences) can be reduced to a total of four multiplications. These four multiplications can be performed in four sequential operations at a higher clock rate than a channel rate using a shared resource, referred to as a compute block 600 with resource-sharing hardware optimizations as illustrated and described below with respect to FIG. 6. The channel rate is the rate at which the fixed-point DSP receives input for processing. The channel rate can be referred to as the slow clock, whereas the fast clock can be the channel rate multiplied by a value corresponding to the number of inputs into the multiplexers used by the shared compute block to perform multiple operations. A multiplexer is a circuit, logic, block, or hardware unit that can select one or more inputs to provide as one or more outputs. For example, a four-to-one multiplexer selects one of our inputs to be output.

FIG. 5B is a diagram illustrating a Radix-3 FFT 506, according to at least one embodiment. The Radix-3 FFT 506 has four paths with multiplications with constants (c0, c1, c2, and c3) that feed into three adders that add the three inputs from the three paths, as described above with respect to the Radix-3 math optimizations.

Figure 6:
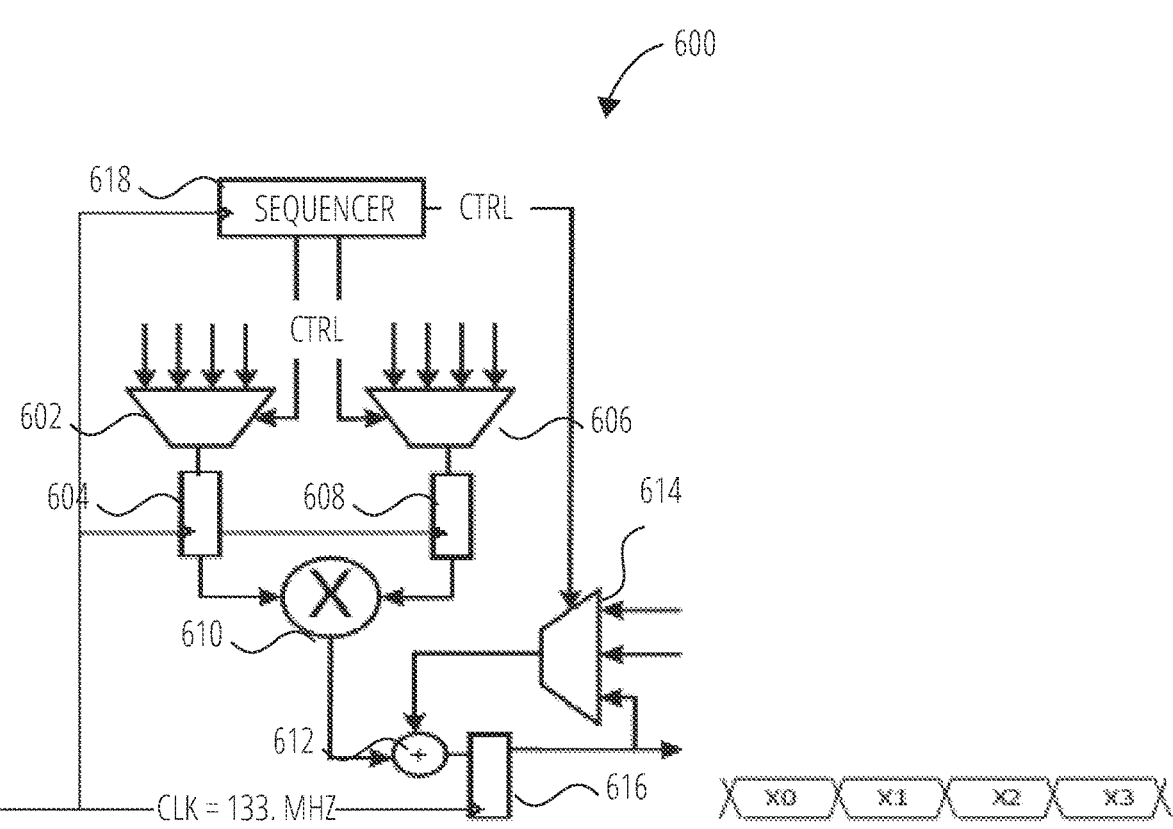
FIG. 6 is a block diagram of a compute block for resource-sharing hardware optimizations, according to at least one embodiment.

FIG. 6 is a block diagram of a compute block 600 for resource-sharing hardware optimizations, according to at least one embodiment. As described above, the compute block 600 can be used by the non-power of two FFT algorithm for resource sharing and time-sharing for a number of multiplications. The compute block 600 can be used for the Radix-3 butterfly nodes 404. The compute block 600 can also be used for Radix-2 butterfly nodes, 6-pt butterfly nodes 410, 12-pt butterfly nodes 414, 24-pt butterfly nodes 418, 48-pt butterfly node 422, and so forth.

As illustrated in FIG. 6, the compute block 600 includes a first multiplexer 602 and a first flip-flop 604 coupled to an output of the first multiplexer 602. The compute block 600 includes a second multiplexer 606 and a second flip-flop 608 coupled to an output of the second multiplexer 606. The compute block 600 includes a multiplier 610 coupled to the first flip-flop 604 and the second flip-flop 608, and an adder 612 coupled to an output of the multiplier 610. A multiplier is a circuit, logic, block, or hardware unit that can multiply two or more values, including real or complex values. An adder is a circuit, logic, block, or hardware unit that can add two or more values. The compute block 600 includes a third multiplexer 614 coupled to the adder 612, and a third flip-flop 616 coupled to an output of the adder 612. The third flip-flop 616 is coupled to an input of the third multiplexer 614 for feedback as one of the possible inputs to adder 612. The compute block 600 includes a sequencer 618 coupled to the first multiplexer 602, the second multiplexer 606, and the third multiplexer 614. The sequencer 618 controls a sequence of inputs of data and twiddle factors into the first multiplexer 602, the second multiplexer 606, and the third multiplexer 614. The sequencer 618, the first flip-flop 604, the second flip-flop 608, and the third flip-flop 616 are clocked at a first rate that is equal to a channel rate, times wherein the first, second, and third flip-flops are clocked at a first rate that is greater than a channel rate of the fixed-point DSP. In at least one embodiment, the first rate is equal to a channel rate multiplied by a value (e.g., 4, 8, or the like) corresponding to a number of inputs of the first multiplexer and the second multiplexer. In at least one embodiment, the first multiplexer 602 and the second multiplexer 606 include four inputs. The design is clocked at 4× the channel rate, such as 133.33 MHz. In another embodiment, the first multiplexer 602 and the second multiplexer 606 include eight inputs, and the design is clocked at 8×, the channel rate, such as 266.67 MHz. In at least one embodiment, the complex-number multiplications and the twiddle factor multiplications can be done using the structure of the compute block 600. Three or four multiplications can use the same compute block 600 for further optimizing efficiency.

In at least one embodiment, the compute block 600 can use a single DSP multiply-accumulate (MAC) unit of a fixed-point DSP. A MAC unit is a circuit, logic, block, or hardware unit in a DSP that can multiply at least two values and add at least two values. The DSP MAC unit can include the multiplier 610 and the adder 612. Using the compute block 600 can reduce the number of DSP MAC units in the hardware design, resulting in a DSP area savings.

In another embodiment, as described herein, the compute block 600 can be used for final leaf nodes. The final leaf nodes can perform complex-number multiplications using at least one of the three-multiply Karatsuba factorization method or the four-multiply method. The final leaf nodes can use arithmetic shifts to avoid multiplications.

In another embodiment, the compute block 600 can include a sequence splitter, a Radix-2 hardware block, a Radix-3 hardware block, including the multipliers, flip-flops, and multiplier as described above, and a complex product summer, such as the adder 612 described above. A complex product summer is a circuit, logic, block, or hardware unit that can sum up two or more complex values. On the data side, the non-power of two FFT algorithm can use these building blocks, including a sequence splitter, a Radix-3 hardware block, and a complex Product summer to generate a hardware design 108 with pipelining for parallelization of operations. On the coefficient side, the compute block 600 can use pre-computed twiddle factors (e.g., pre-computed scalers in fixed point). The compute block 600 can be used to achieve reduced multiplications and additions and lends itself well to hardware code generation, which speeds up design and verification efforts.

FIG. 7 illustrates an example trace graph 700 of an FFT hardware architecture, according to at least one embodiment. For the trace graph 700, N is equal to 192 (e.g., N=192). The first column shows a first portion of the trace graph 700 for the initial first sequence, Recursive Loop 96 702. The second column shows a second portion of the trace graph 700 for the initial second sequence, Recursive Loop 96. The first portion is broken down into two Recursive Loops 48, four Recursive Loops 24, eight Recursive Loops 12, and sixteen Recursive Loops 6. Each Recursive Loop 6 includes two Radix-3 butterfly operations. The Radix-3 butterfly operations can be performed by the Radix-3 butterfly nodes 404 of FIG. 4. The operations of the Recursive Loop 6 can be performed by the 6-pt butterfly nodes 410 of FIG. 4. The operations of the Recursive Loop 12 can be performed by the 12-pt butterfly nodes 414 of FIG. 4. The operations of the Recursive Loop 24 can be performed by the 24-pt butterfly nodes 418 of FIG. 4. The operations of the Recursive Loop 48 can be performed by 48-pt butterfly nodes, like two of the 48-pt butterfly node 422 of FIG. 4. The operations of the Recursive Loop 96 can be performed by a 96-point butterfly node.

Figure 8:
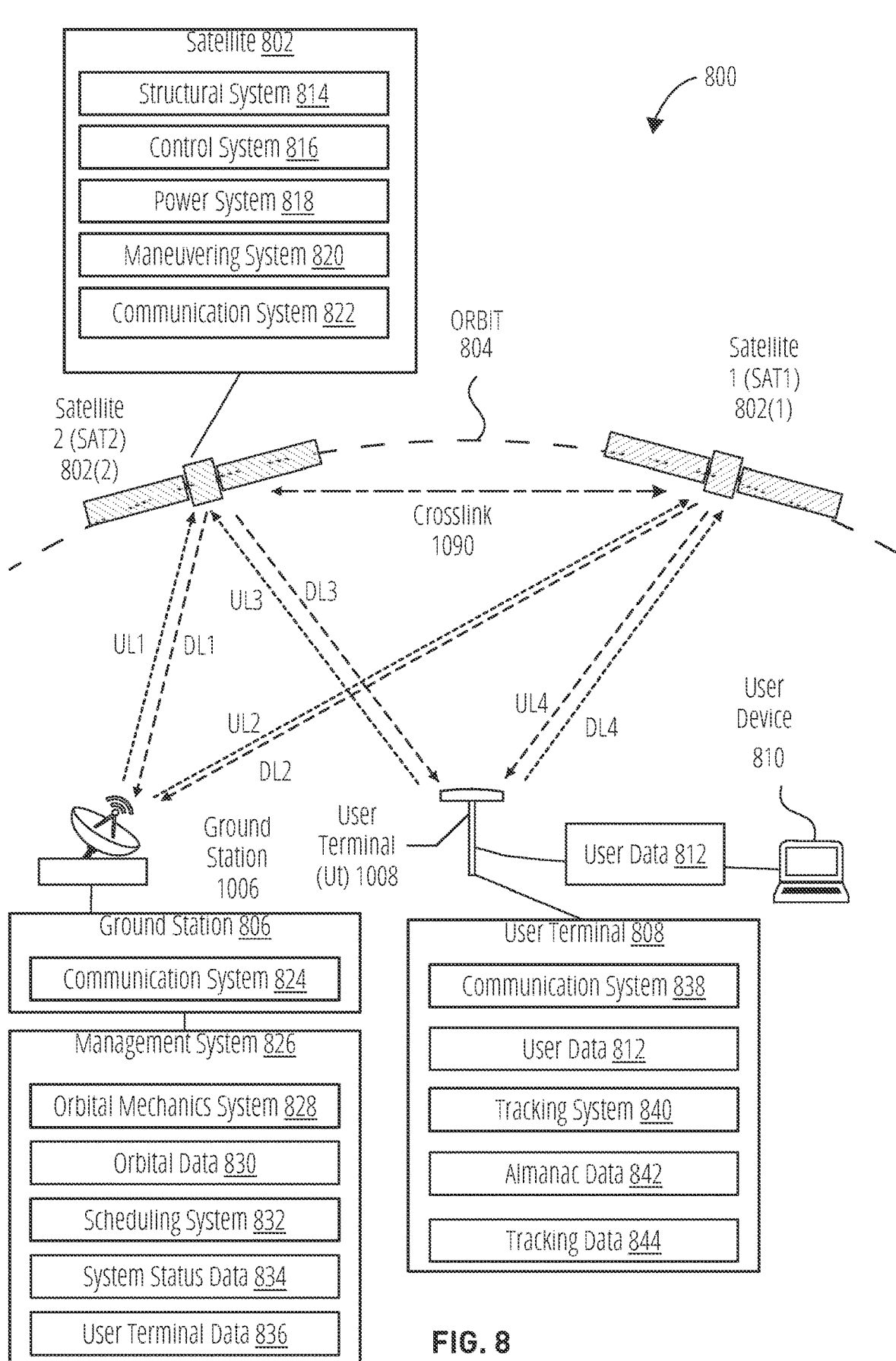
FIG. 8 illustrates a portion of a communication system that includes two satellites of a constellation of satellites, each satellite being in orbit, according to embodiments of the present disclosure.

FIG. 8 illustrates a portion of a communication system 800 that includes two satellites of a constellation of satellites 802(1), 802(2), . . . , 802(S), each satellite 802 being in orbit 804 according to embodiments of the present disclosure. The communication system 800 shown here comprises a plurality (or "constellation") of satellites 802(1), 1002(2), . . . , 1002(S), each satellite 802 being in orbit 804. Any of the satellites 802 can include the communication system described herein. Also shown is a ground station 806, user terminal (UT) 808, and a user device 810.

The constellation may comprise hundreds or thousands of satellites 802, in various orbits 804. For example, one or more of these satellites 802 may be in non-geosynchronous orbits (NGOs) in which they are in constant motion with respect to the Earth. For example, orbit 804 is a low-Earth orbit (LEO). In this illustration, orbit 804 is depicted with an arc pointed to the right. A first satellite (SAT1) 802(1) is leading (ahead of) a second satellite (SAT2) 802(2) in the orbit 804.

Satellite 802 may comprise a structural system 814, a control system 816, a power system 818, a maneuvering system 820, and a communication system 822 described herein. In other implementations, some systems may be omitted, or other systems added. One or more of these systems may be communicatively coupled with one another in various combinations.

The structural system 814 comprises one or more structural elements to support the operation of satellite 802. For example, the structural system 814 may include trusses, struts, panels, and so forth. The components of other systems may be affixed to, or housed by, the structural system 814. For example, the structural system 814 may provide mechanical mounting and support for solar panels in the power system 818. The structural system 814 may also provide thermal control to maintain components of the satellite 802 within operational temperature ranges. For example, the structural system 814 may include louvers, heat sinks, radiators, and so forth.

The control system 816 provides various services, such as operating the onboard systems, resource management, providing telemetry, processing commands, and so forth. For example, the 816 may direct the operation of the communication system 822.

The power system 818 provides electrical power for the operation of the components onboard satellite 802. The power system 818 may include components to generate electrical energy. For example, the power system 818 may comprise one or more photovoltaic cells, thermoelectric devices, fuel cells, and so forth. The power system 818 may include components to store electrical energy. For example, the power system 818 may comprise one or more batteries, fuel cells, and so forth.

The maneuvering system 820 maintains the satellite 802 in one or more of a specified orientation or orbit 804. For example, the maneuvering system 820 may stabilize satellite 802 with respect to one or more axis. In another example, the maneuvering system 820 may move the satellite 802 to a specified orbit 804. The maneuvering system 820 may include one or more computing devices, sensors, thrusters, momentum wheels, solar sails, drag devices, and so forth. For example, the sensors of the maneuvering system 820 may include one or more global navigation satellite system (GNSS) receivers, such as global positioning system (GPS) receivers, to provide information about the position and orientation of the satellite 802 relative to Earth. In another example, the sensors of the maneuvering system 820 may include one or more star trackers, horizon detectors, and so forth. The thrusters may include, but are not limited to, cold gas thrusters, hypergolic thrusters, solid-fuel thrusters, ion thrusters, arcjet thrusters, electrothermal thrusters, and so forth.

The communication system 822 provides communication with one or more other devices, such as other satellites 802, ground stations 806, user terminals 808, and so forth. The communication system 822 may include one or more modems, digital signal processors, power amplifiers, antennas (including at least one antenna that implements multiple antenna elements, such as a phased array antenna), processors, memories, storage devices, communications peripherals, interface buses, and so forth. Such components support communications with other satellites 802, ground stations 806, user terminals 808, and so forth, using radio frequencies within the desired frequency spectrum. The communications may involve multiplexing, encoding, and compressing data to be transmitted, modulating the data to the desired radio frequency, and amplifying it for transmission. The communications may also involve demodulating received signals and performing any necessary de-multiplexing, decoding, decompressing, error correction, and formatting of the signals. Data decoded by the communication system 822 may be output to other systems, such as the control system 816, for further processing. Output from a system, such as the control system 816, may be provided to the communication system 822 for transmission.

One or more ground stations 806 communicate with one or more satellites 802. The ground stations 806 may pass data between the satellites 802, a management system 826, networks such as the Internet, and so forth. The ground stations 806 may be emplaced on land, on vehicles, at sea, and so forth. Each ground station 806 may comprise a communication system 824. Each ground station 806 may use the communication system 824 to establish communication with one or more satellites 802, other ground stations 806, and so forth. The ground station 806 may also be connected to one or more communication networks. For example, the ground station 806 may connect to a terrestrial fiber optic communication network. The ground station 806 may act as a network gateway, passing user data 812 or other data between the one or more communication networks and the satellites 802. Such data may be processed by the ground station 806 and communicated via the communication system 824. The communication system 824 of a ground station may include components similar to those of the communication system 824 of a satellite 802 and may perform similar communication functionalities. For example, the communication system 824 may include one or more modems, digital signal processors, power amplifiers, antennas (including at least one antenna that implements multiple antenna elements, such as a phased array antenna), processors, memories, storage devices, communications peripherals, interface buses, and so forth.

The ground stations 806 are in communication with a management system 826. The management system 826 is also in communication, via the ground stations 806, with the satellites 802 and the UTs 808. The management system 826 coordinates the operation of the satellites 802, ground stations 806, UTs 808, and other resources of the communication system 800. The management system 826 may comprise one or more of an orbital mechanics system 828 or a scheduling system 832. In some embodiments, the scheduling system 832 can operate in conjunction with an HD controller.

The orbital mechanics system 828 determines orbital data 830 that is indicative of a state of a particular satellite 802 at a specified time. In one implementation, the orbital mechanics system 828 may use orbital elements that represent characteristics of the orbit 804 of the satellites 802 in the constellation to determine the orbital data 830 that predicts location, velocity, and so forth of particular satellites 802 at particular times or time intervals. For example, the orbital mechanics system 828 may use data obtained from actual observations from tracking stations, data from the satellites 802, scheduled maneuvers, and so forth to determine the orbital elements. The orbital mechanics system 828 may also consider other data, such as space weather, collision mitigation, orbital elements of known debris, and so forth.

The scheduling system 832 schedules resources to provide communication to the UTs 808. For example, the scheduling system 832 may determine handover data that indicates when communication is to be transferred from the first satellite 802(1) to the second satellite 802(2). Continuing the example, the scheduling system 832 may also specify communication parameters such as frequency, timeslot, and so forth. During operation, the scheduling system 832 may use information such as the orbital data 830, system status data 834, user terminal data 836, and so forth.

The system status data 834 may comprise information such as which UTs 808 are currently transferring data, satellite availability, current satellites 802 in use by respective UTs 808, capacity available at particular ground stations 806, and so forth. For example, the satellite availability may comprise information indicative of satellites 802 that are available to provide communication service or those satellites 802 that are unavailable for communication service. Continuing the example, a satellite 802 may be unavailable due to malfunction, previous tasking, maneuvering, and so forth. The system status data 834 may be indicative of past status, predictions of future status, and so forth. For example, the system status data 834 may include information such as projected data traffic for a specified interval of time based on previous transfers of user data 812. In another example, the system status data 834 may be indicative of future status, such as a satellite 802 being unavailable to provide communication service due to scheduled maneuvering, scheduled maintenance, scheduled decommissioning, and so forth.

The user terminal data 836 may comprise information such as a location of a particular UT 808. The user terminal data 836 may also include other information such as a priority assigned to user data 812 associated with that UT 808, information about the communication capabilities of that particular UT 808, and so forth. For example, a particular UT 808 in use by a business may be assigned a higher priority relative to a UT 808 operated in a residential setting. Over time, different versions of UTs 808 may be deployed, having different communication capabilities such as being able to operate at particular frequencies, supporting different signal encoding schemes, having different antenna configurations, and so forth.

The UT 808 includes a communication system 838 to establish communication with one or more satellites 802. The communication system 838 of the UT 808 may include components similar to those of the communication system 822 of a satellite 802 and may perform similar communication functionalities. For example, the communication system 838 may include one or more modems, digital signal processors, power amplifiers, antennas (including at least one antenna that implements multiple antenna elements, such as a phased array antenna), processors, memories, storage devices, communications peripherals, interface buses, and so forth. The UT 808 passes user data 812 between the constellation of satellites 802 and the user device 810. The user data 812 includes data originated by the user device 810 or addressed to the user device 810. The UT 808 may be fixed or in motion. For example, the UT 808 may be used at a residence, or on a vehicle such as a car, boat, aerostat, drone, airplane, and so forth.

The UT 808 includes a tracking system 840. The tracking system 840 uses almanac data 842 to determine tracking data 844. The almanac data 842 provides information indicative of orbital elements of the orbit 804 of one or more satellites 802. For example, the almanac data 842 may comprise orbital elements such as "two-line element" data for the satellites 802 in the constellation broadcast or otherwise sent to the UTs 808 using the communication system 838.

The tracking system 840 may use the current location of the UT 808 and the almanac data 842 to determine the tracking data 844 for satellite 802. For example, based on the current location of the UT 808 and the predicted position and movement of the satellites 802, the tracking system 840 can calculate the tracking data 844. The tracking data 844 may include information indicative of azimuth, elevation, distance to the second satellite, time of flight correction, or other information at a specified time. The determination of the tracking data 844 may be ongoing. For example, the first UT 808 may determine tracking data 844 every 700 ms, every second, every five seconds, or other intervals.

With regard to FIG. 8, an uplink is a communication link that allows data to be sent to satellite 802 from a ground station 806, UT 808, or device other than another satellite 802. Uplinks are designated as UL1, UL2, UL3, and so forth. For example, UL1 is a first uplink from the ground station 806 to the second satellite 802(2). In comparison, a downlink is a communication link that allows data to be sent from satellite 802 to a ground station 806, UT 808, or device other than another satellite 802. For example, DL1 is a first downlink from the second satellite 802(2) to the ground station 806. The satellites 802 may also be in communication with one another. For example, a crosslink 1090 provides for communication between satellites 802 in the constellation.

The satellite 802, the ground station 806, the user terminal 808, the user device 810, the management system 826, or other systems described herein may include one or more computing devices or computer systems comprising one or more hardware processors, computer-readable storage media, and so forth. For example, the hardware processors may include ASICs, FPGAs, microcontrollers, DSPs, and so forth. The computer-readable storage media can include system memory, which may correspond to any combination of volatile and/or non-volatile memory or storage technologies. The system memory can store information that provides an operating system, various program modules, program data, and/or other software or firmware components. In one embodiment, the system memory stores instructions of methods to control the operation of the electronic device. The electronic device performs functions by using the processor(s) to execute instructions provided by the system memory. Embodiments may be provided as a software program or computer program, including a non-transitory computer-readable storage medium having stored thereon instructions (in compressed or uncompressed form) that may be used to program a computer (or other electronic devices) to perform the processes or methods described herein. The computer-readable storage medium may be one or more of an electronic storage medium, a magnetic storage medium, an optical storage medium, a quantum storage medium, and so forth. For example, the computer-readable storage medium may include, but is not limited to, hard drives, floppy diskettes, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions. Further embodiments may also be provided as a computer program product, including a transitory machine-readable signal (in compressed or uncompressed form). Examples of transitory machine-readable signals, whether modulated using a carrier or unmodulated, include, but are not limited to, signals that a computer system or machine hosting or running a computer program can be configured to access, including signals transferred by one or more networks. For example, the transitory machine-readable signal may comprise the transmission of software by the Internet.

Figure 9:
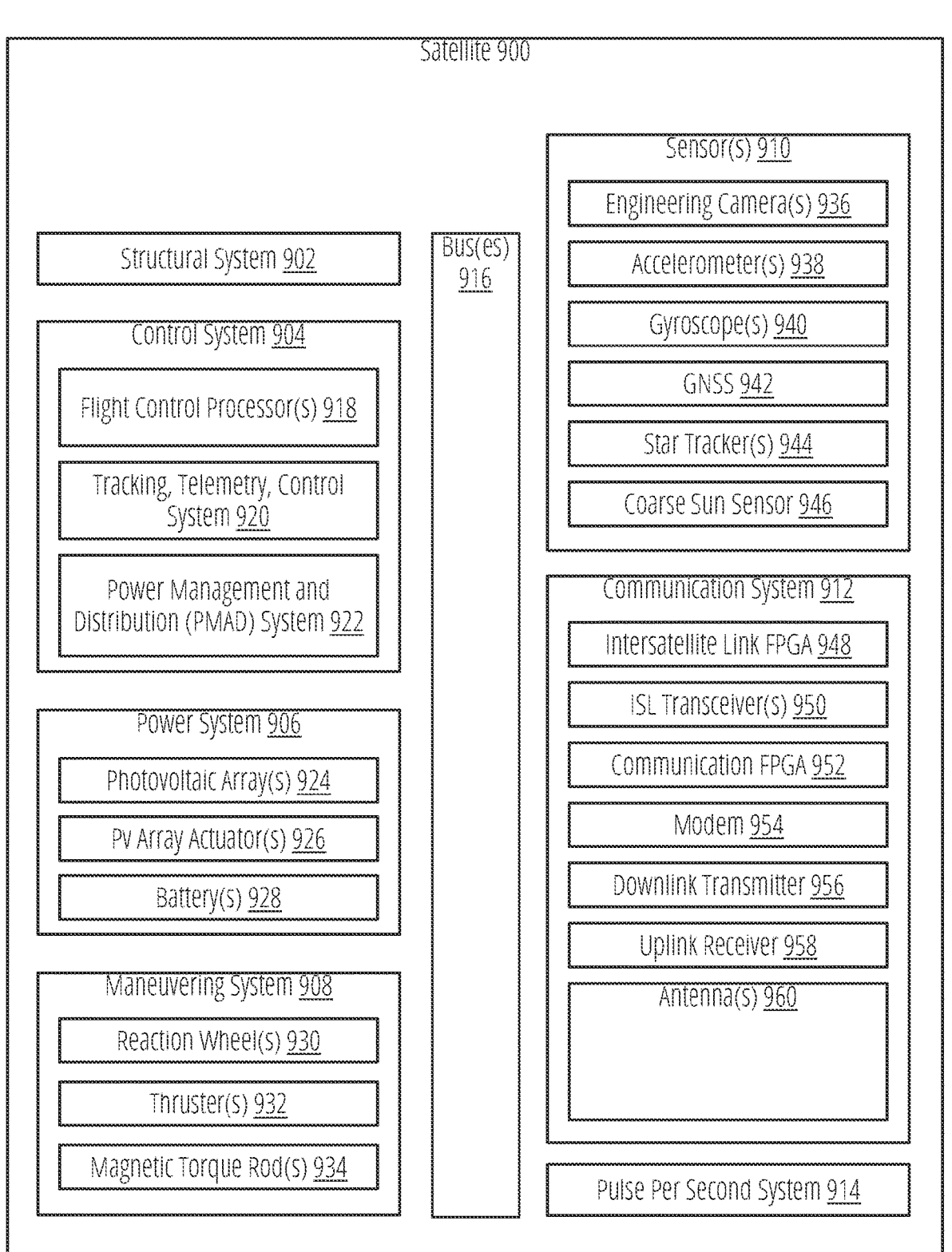
FIG. 9 is a functional block diagram of some systems associated with the satellite, according to some implementations.

FIG. 9 is a functional block diagram of some systems associated with satellite 900, according to some implementations. The satellite 900 can be similar to the satellite 802 described above. The satellite 900 may comprise a structural system 902, a control system 904, a power system 906, a maneuvering system 908, one or more sensor(s) 910, and a communication system 912. A pulse per second (PPS) system 914 may be used to provide a timing reference to the systems onboard satellite 900. One or more bus(es) 916 may be used to transfer data between the systems onboard satellite 900. In some implementations, redundant bus(es) 916 may be provided. The buses 916 may include, but are not limited to, data buses such as Controller Area Network Flexible Data Rate (CAN FD), Ethernet, Serial Peripheral Interface (SPI), and so forth. In some implementations, the buses 916 may carry other signals. For example, a radio frequency bus may comprise a coaxial cable, waveguides, and so forth to transfer radio signals from one part of the satellite 900 to another. In other implementations, some systems may be omitted, or other systems added. One or more of these systems may be communicatively coupled with one another in various combinations.

The structural system 902 comprises one or more structural elements to support the operation of satellite 900. For example, the structural system 902 may include trusses, struts, panels, and so forth. The components of other systems may be affixed to, or housed by, the structural system 902. For example, the structural system 902 may provide mechanical mounting and support for solar panels in the power system 906. The structural system 902 may also provide for thermal control to maintain components of the satellite 900 within operational temperature ranges. For example, the structural system 902 may include louvers, heat sinks, radiators, and so forth.

The control system 904 provides various services, such as operating the onboard systems, resource management, providing telemetry, processing commands, and so forth. For example, the control system 904 may direct the operation of the communication system 912. The control system 904 may include one or more flight control processor(s) 918. The flight control processor(s) 918 may comprise one or more processors, FPGAs, and so forth. A tracking, telemetry, and control (TTC) system 920 may include one or more processors, radios, and so forth. For example, the TTC system 920 may comprise a dedicated radio transmitter and receiver to receive commands from a ground station 806, send telemetry to the ground station 806, and so forth. Power Management and Distribution (PMAD) System 922 may direct operation of the power system 906, control the distribution of power to the systems of the satellite 900, control battery 928 charging, and so forth.

The power system 906 provides electrical power for the operation of the components onboard the satellite 900. The power system 906 may include components to generate electrical energy. For example, the power system 906 may comprise one or more photovoltaic arrays 924 comprising a plurality of photovoltaic cells, thermoelectric devices, fuel cells, and so forth. One or more photovoltaic (PV) array actuators 926 may be used to change the orientation of the photovoltaic array(s) 924 relative to the satellite 900. For example, the PV array actuator 926 may comprise a motor. The power system 906 may include components to store electrical energy. For example, the power system 906 may comprise one or more batteries 928, fuel cells, and so forth.

The maneuvering system 908 maintains the satellite 900 in one or more of a specified orientation or orbit 804. For example, the maneuvering system 908 may stabilize satellite 900 with respect to one or more axes. In another example, the maneuvering system 908 may move the satellite 900 to a specified orbit 804. The maneuvering system 908 may include one or more of reaction wheel(s) 930, thrusters 932, magnetic torque rods 934, solar sails, drag devices, and so forth. The thrusters 932 may include, but are not limited to, cold gas thrusters, hypergolic thrusters, solid-fuel thrusters, ion thrusters, arcjet thrusters, electrothermal thrusters, and so forth. During operation, the thrusters may expend propellant. For example, an electrothermal thruster may use water as propellant, using electrical power obtained from the power system 906 to expel the water and produce thrust. During operation, the maneuvering system 908 may use data obtained from one or more of the sensor(s) 910.

Satellite 900 includes one or more sensors 910. The sensors 910 may include one or more engineering cameras engineering camera(s) 936. For example, an engineering camera 936 may be mounted on satellite 900 to provide images of at least a portion of the photovoltaic array(s) 924. Accelerometers 938 provide information about the acceleration of satellite 900 along one or more axes. Gyroscopes 940 provide information about the rotation of satellite 900 with respect to one or more axes. The sensors 910 may include a global navigation satellite system (GNSS) 942 receiver, such as Global Positioning System (GPS) receiver, to provide information about the position of the satellite 900 relative to Earth. In some implementations, the GNSS 942 may also provide information indicative of velocity, orientation, and so forth. One or more star tracker(s) 944 may be used to determine an orientation of satellite 900. A coarse sun sensor 946 may be used to detect the sun, provide information on the relative position of the sun with respect to satellite 900, and so forth. The satellite 900 may include other sensors 910 as well. For example, satellite 900 may include a horizon detector, radar, LIDAR, and so forth.

The communication system 912 provides communication with one or more other devices, such as other satellites 900, ground stations 806, user terminals 808, and so forth. The communication system 912 may include one or more modems 954, digital signal processors, power amplifiers, antenna(s) 960 (including at least one antenna that implements multiple antenna elements), processors, memories, storage devices, communications peripherals, interface buses, and so forth. Such components support communications with other satellites 900, ground stations 806, user terminals 808, and so forth, using radio frequencies within the desired frequency spectrum. The communications may involve multiplexing, encoding, and compressing data to be transmitted, modulating the data to the desired radio frequency, and amplifying it for transmission. The communications may also involve demodulating received signals and performing any necessary de-multiplexing, decoding, decompressing, error correction, and formatting of the signals. Data decoded by the communication system 912 may be output to other systems, such as the control system 904, for further processing. Output from a system, such as the control system 904, may be provided to the communication system 912 for transmission.

The communication system 912 may include hardware to support the intersatellite link (ISL) 1090. For example, an Intersatellite Link FPGA 948 may be used to modulate data that is sent and received by an ISL Transceiver(s) 950 to send data between satellites 900. The ISL transceiver 950 may operate using radio frequencies, optical frequencies, and so forth.

A communication FPGA 952 may be used to facilitate communication between satellite 900 and the ground stations 806, UTs 808, and so forth. For example, the communication FPGA 952 may direct the operation of a modem 954 to modulate signals sent using a downlink transmitter 956 and demodulate signals received using an uplink receiver 958. The satellite 900 may include one or more antenna(s) 960. For example, one or more parabolic antennas may be used to provide communication between satellite 900 and one or more ground stations 806. In another example, a phased array antenna may be used to provide communication between satellite 900 and the UTs 808.

Figure 10:
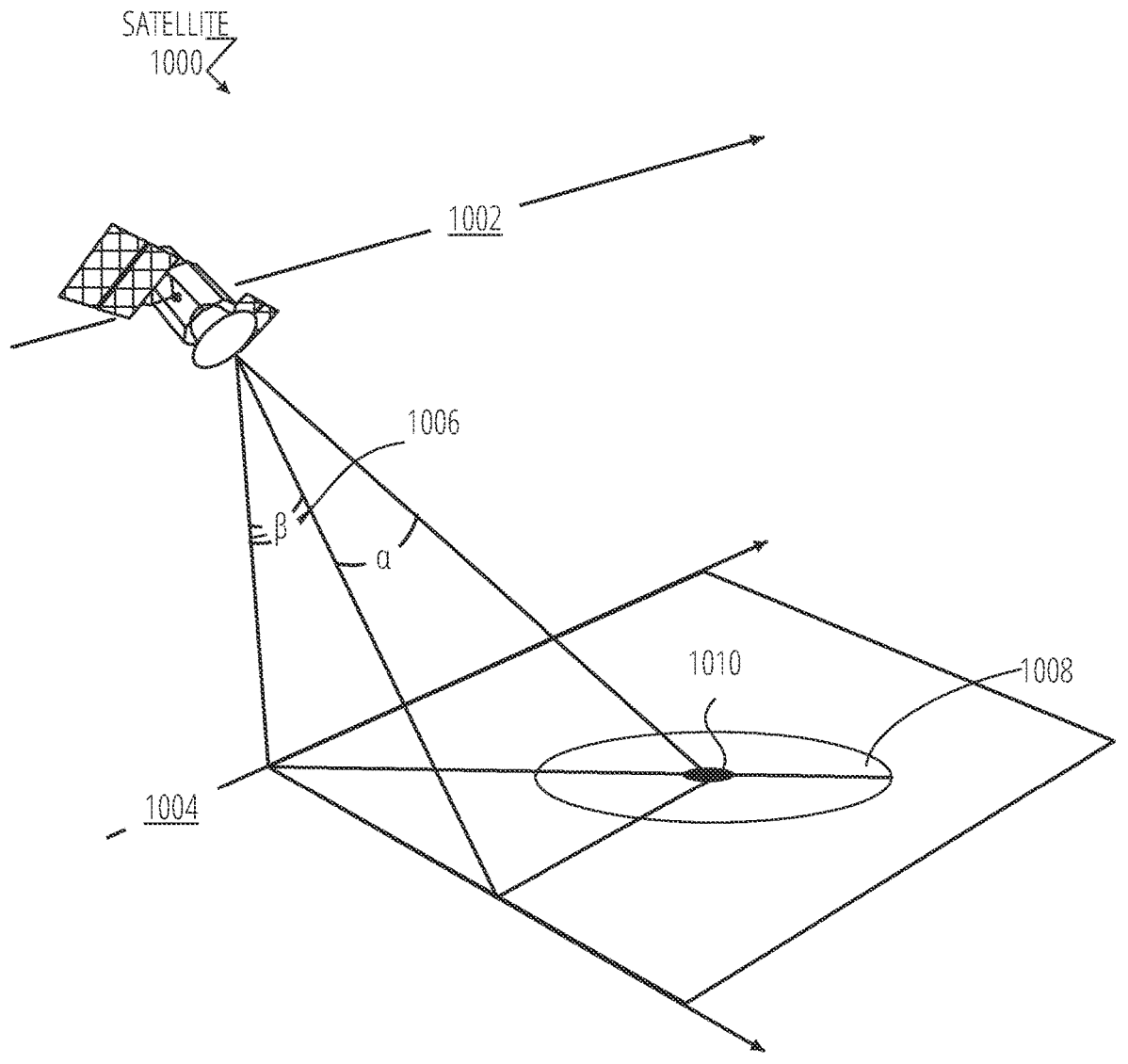
FIG. 10 illustrates a satellite including an antenna system that is steerable, according to embodiments of the present disclosure.

FIG. 10 illustrates the satellite 1000 including an antenna system that is steerable according to embodiments of the present disclosure. The satellite 1000 can include the communication system as described herein. The antenna system may include multiple antenna elements that form an antenna, and that can be mechanically or electrically steered individually, collectively, or a combination thereof. For example, the antenna is a phased array antenna.

In orbit 804, the satellite 1000 follows a path 1002, the projection of which onto the surface of the Earth forms a ground path 1004. In the example illustrated in FIG. 10, the ground path 1004 and a projected axis extending orthogonally from the ground path 1004 at the position of the satellite 1000, together define a region 1008 of the surface of the Earth. In this example, the satellite 1000 can establish uplink and downlink communications with one or more ground stations, user terminals, or other devices within region 1008. In some embodiments, region 1008 may be located in a different relative position to the ground path 1004 and the position of the satellite 1000. For example, region 1008 may describe a region of the surface of the Earth directly below satellite 1000. Furthermore, embodiments may include communications between the satellite 1000, an airborne communications system, and so forth.

As shown in FIG. 10, a communication target 1010 (e.g., a ground station, a user terminal, or a CT (such as an HD CT)) is located within region 1008. The satellite 1000 controls the antenna system to steer the transmission and reception of communications signals to selectively communicate with the communication target 1010. For example, in a downlink transmission from satellite 1000 to the communication target 1010, a signal beam 1006 emitted by the antenna system is steerable within an area of the region 1008. In some implementations, the signal beam 1006 may include multiple subbeams. The extents of the area define an angular range within which the signal beam 1006 is steerable, where the direction of the signal beam 1006 is described by a beam angle "a" relative to a surface normal vector of the antenna system. In two-dimensional phased array antennas, the signal beam 1006 is steerable in two dimensions, described in FIG. 10 by a second angle "p" orthogonal to the beam angle α. In this way, the area is a two-dimensional area within the region 1008, rather than a linear track at a fixed angle determined by the orientation of the antenna system relative to the ground path 1004.

In FIG. 10, as the satellite 1000 follows the path 1002, the area tracks along the surface of the Earth. In this way, the communication target 1010, which is shown centered in the area for clarity, is within the angular range of the antenna system for a period of time. During that time, signals communicated between satellite 1000 and the communication target 1010 are subject to bandwidth constraints, including but not limited to signal strength and calibration of the signal beam 1006. For example, for phased array antenna systems, the signal beam 1006 is generated by an array of mutually coupled antenna elements, wherein constructive and destructive interference produce a directional beam. Among other factors, phase drift, amplitude drift (e.g., of a transmitted signal in a transmitter array), and so forth affect the interference properties and thus the resultant directional beam or subbeam.

Figure 11:
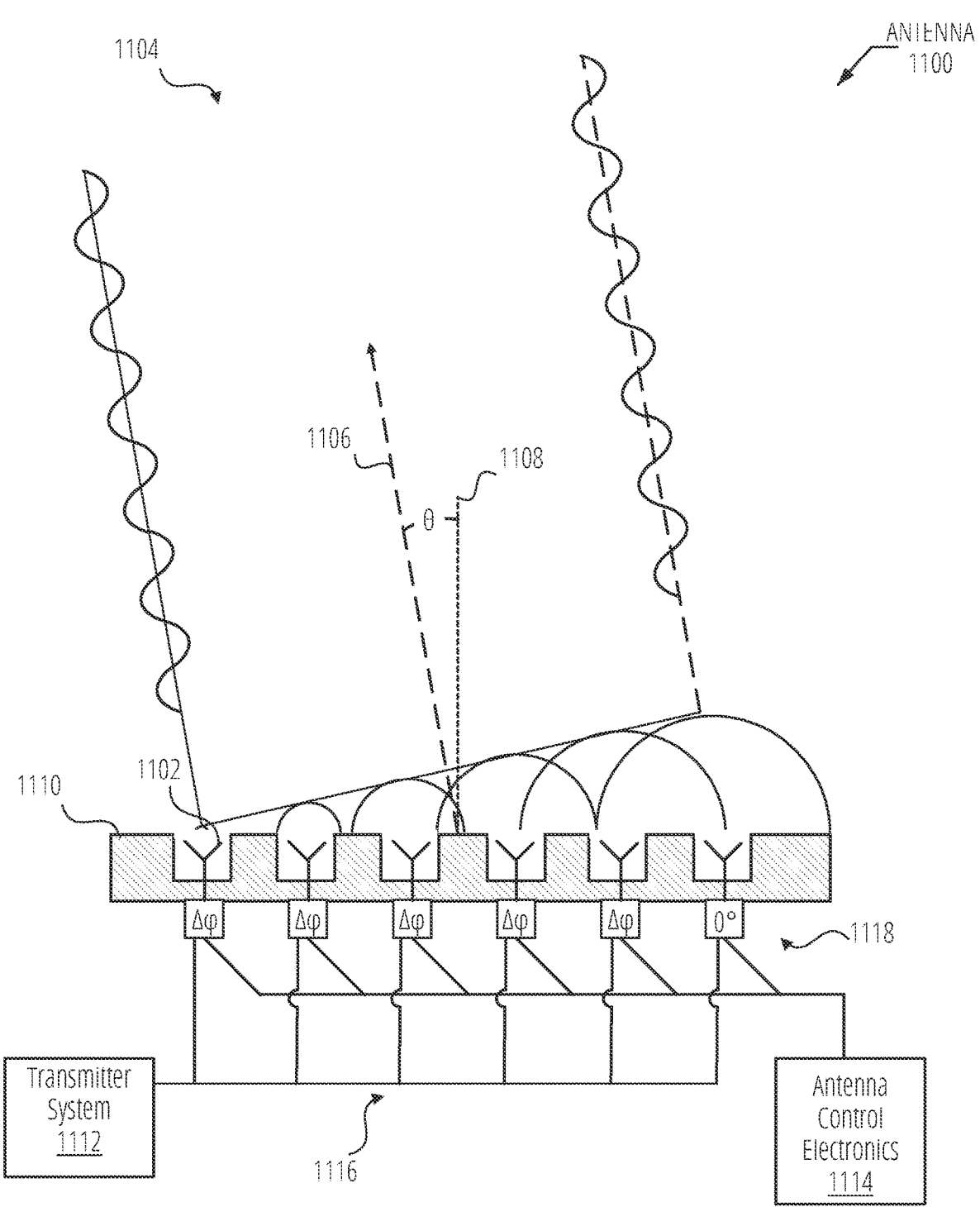
FIG. 11 illustrates a simplified schematic of an antenna, according to embodiments of the present disclosure.

FIG. 11 illustrates a simplified schematic of an antenna 1100, according to embodiments of the present disclosure. The antenna 1100 may be a component of the antenna system of FIG. 10. As illustrated, the antenna 1100 is a phased array antenna that includes multiple antenna elements 1102. Interference between the antenna elements 1102 forms a directional radiation pattern in both transmitter and receiver arrays, forming a beam 1104 (beam extents shown as dashed lines). The beam 1104 is a portion of a larger transmission pattern (not shown) that extends beyond the immediate vicinity of the antenna 1100. The beam 1104 is directed along a beam vector 1106, described by an angle "θ" relative to an axis 1108 normal to a surface of the antenna 1100. As described below, beam 1104 is one or more of steerable or shapeable through control of operating parameters including, but not limited to a phase and an amplitude of each antenna element 1102

In FIG. 11, the antenna 1100 includes, within a transmitter section 1110, the antenna elements 1102, which may include but are not limited to, omnidirectional transmitter antennas coupled to a transmitter system 1112, such as the downlink transmitter 956. The transmitter system 1112 provides a signal, such as a downlink signal transmitted to a ground station on the surface. The downlink signal is provided to each antenna element 1102 as a time-varying signal that may include several multiplexed signals. To steer the beam 1104 relative to the axis 1108, the phased array antenna system includes antenna control electronics 1114 controlling a radio frequency (RF) feeding network 1116, including multiple signal conditioning components 1118 interposed between the antenna elements 1102 and the transmitter system 1112. The signal conditioning components 1118 introduce one or more of a phase modulation or an amplitude modulation (e.g., by phase shifters), as denoted by "Δφ" in FIG. 11, to the signal sent to the antenna elements 1102. As shown in FIG. 11, introducing a progressive phase modulation produces interference in the individual transmission of each antenna element 1102 that generates the beam 1104.

The phase modulation imposed on each antenna element 1102 can differ and can be dependent on a spatial location of a communication target that determines an optimum beam vector (e.g., where the beam vector 1106 is found by one or more of maximizing signal intensity or connection strength). The optimum beam vector may change with time as the communication target 1010 moves relative to the phased array antenna system.

In the above description, numerous details are set forth. It will be apparent, however, to one of ordinary skill in the art having the benefit of this disclosure, that embodiments may be practiced without these specific details. In some instances, well-known structures and devices are shown in block diagram form, rather than in detail to avoid obscuring the description.

Some portions of the detailed description are presented in terms of algorithms and symbolic representations of operations on data bits within a computer memory. These algorithmic descriptions and representations are the means used by those skilled in the data processing arts to convey the substance of their work most effectively to others skilled in the art. An algorithm is used herein, and generally, conceived to be a self-consistent sequence of steps leading to the desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the above discussion, it is appreciated that throughout the description, discussions utilizing terms such as "determining," "sending," "receiving," "scheduling," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk, including floppy disks, optical disks, Read-Only Memories (ROMs), compact disc ROMs (CD-ROMs), and magnetic-optical disks, Random Access Memories (RAMs), EPROMs, EEPROMs, magnetic or optical cards, or any type of media suitable for storing electronic instructions.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the present embodiments as described herein. It should also be noted that the terms "when" or the phrase "in response to," as used herein, should be understood to indicate that there may be intervening time, intervening events, or both before the identified operation is performed.

It is to be understood that the above description is intended to be illustrative, and not restrictive. Many other embodiments will be apparent to those of skill in the art upon reading and understanding the above description. The scope of the present embodiments should, therefore, be determined with reference to the appended claims, along with the full scope of equivalents to which such claims are entitled.

What is claimed is:

1. A computing system, comprising:
a memory device to store instructions of a compiler that implements a non-power of two Fast Fourier Transform (FFT) algorithm using a recursive function; and
a processing device operatively coupled to the memory device, the processing device to execute the instructions of the compiler to perform operations comprising:
receiving input specifying a sequence of indexes and a bit width of a fixed-point digital signal processor (DSP);
performing a process that splits the sequence using a recursive loop, wherein the recursive loop determines a number of multiplications in a hardware design of a plurality of compute blocks of the fixed-point DSP, determines a number of FFT points, identifies operations for serialization at a first rate that is greater than a channel rate of the fixed-point DSP, and identifies operations for math optimizations, and generates a trace graph of the non-power of two FFT algorithm corresponding to an addressing scheme of the hardware design, wherein the process uses the recursive function and ends when the recursive loop decrements to a value corresponding to a Radix-3 or Radix-2; and
outputting data comprising at least the number of multiplications in the hardware design, the number of FFT points, and the trace graph.

2. The computing system of claim 1, wherein the process is a decimation-in-time FFT (DITFFT) or a decimation-in-frequency FFT (DIFFFT) process.

3. The computing system of claim 1, wherein the non-power of two FFT algorithm uses resource sharing of a compute block of the plurality of compute blocks and identifies a number of multiplications of the operations for serialization to be performed at the first rate within the compute block.

4. The computing system of claim 1, wherein the plurality of compute blocks comprises computing butterfly nodes, wherein a computing butterfly node comprises:
a first multiplexer and a second multiplexer;
a first flip-flop coupled to an output of the first multiplexer and a second flip-flop coupled to an output of the second multiplexer;
a multiplier coupled to the first flip-flop and the second flip-flop;
an adder coupled to an output of the multiplier;
a third multiplexer coupled to the adder;
a third flip-flop coupled to an output of the adder, the third flip-flop being coupled to an input of the third multiplexer; and a sequencer that controls a sequence of inputs of data and twiddle factors into the first, second, and third multiplexers, wherein the first, second, and third flip-flops are clocked at a first rate that is greater than a channel rate of the fixed-point DSP.

5. The computing system of claim 4, wherein the multiplier and the adder are part of a multiply-accumulate (MAC) unit of the fixed-point DSP.

6. The computing system of claim 1, wherein the plurality of compute blocks comprises leaf nodes, and wherein the leaf nodes perform complex-number multiplications using at least one of a three-multiply Karatsuba factorization method or a four-multiply method.

7. The computing system of claim 1, wherein each of the plurality of compute blocks comprises:

a sequence splitter;

a Radix-2 hardware block;

a Radix-3 hardware block; and a complex product summer, wherein the Radix-3 hardware block reduces nine complex-number multiplications into four multiplications, wherein the Radix-3 hardware block uses arithmetic shifts, pre-computes scalers in fixed point, and negates for math optimizations.

8. A method comprising:

receiving, at a compiler that implements a non-power of two Fast Fourier Transform (FFT) algorithm using a recursive function, input specifying a sequence of indexes and a bit width of a fixed-point digital signal processor (DSP), wherein instructions for the compiler are stored in a memory device;

performing, by a processor communicatively coupled with the memory device and configured to execute the instructions, a process that splits the sequence using a recursive loop, wherein the recursive loop determines a number of multiplications in a hardware design of a plurality of compute blocks of the fixed-point DSP, determines a number of FFT points, identifies operations for serialization at a first rate that is greater than a channel rate of the fixed-point DSP, and identifies operations for math optimizations, and generates a trace graph of the non-power of two FFT algorithm corresponding to an addressing scheme of the hardware design, wherein the process uses the recursive function and ends when the recursive loop decrements to a value corresponding to a Radix-3 or Radix-2; and outputting data comprising at least the number of multiplications in the hardware design, the number of FFT points, and the trace graph.

9. The method of claim 8, wherein the process is a decimation-in-time FFT (DITFFT) process or a decimation-in-frequency FFT (DIFFFT) process.

10. The method of claim 8, wherein the non-power of two FFT algorithm uses resource sharing of a compute block of the plurality of compute blocks and identifies a number of multiplications of the operations for serialization to be performed at the first rate within the compute block.

11. The method of claim 8, wherein the plurality of compute blocks comprises computing butterfly nodes, wherein a computing butterfly node comprises:

a first multiplexer and a second multiplexer;

a first flip-flop coupled to an output of the first multiplexer and a second flip-flop coupled to an output of the second multiplexer;

a multiplier coupled to the first flip-flop and the second flip-flop an adder coupled to an output of the multiplier;

a third multiplexer coupled to the adder;

a third flip-flop coupled to an output of the adder, the third flip-flop being coupled to an input of the third multiplexer; and a sequencer that controls a sequence of inputs of data and twiddle factors into the first, second, and third multiplexers, wherein the first, second, and third flip-flops are clocked at a first rate that is greater than a channel rate of the fixed-point DSP.

12. The method of claim 11, wherein the multiplier and the adder are part of a multiply-accumulate (MAC) unit of the fixed-point DSP.

13. The method of claim 8, wherein the plurality of compute blocks comprises leaf nodes, and wherein the leaf nodes perform complex-multiplications using at least one of a three-multiply Karatsuba factorization method or a four-multiply method.

14. The method of claim 8, wherein each of the plurality of compute blocks comprises:

a sequence splitter;

a Radix-2 hardware block;

a Radix-3 hardware block; and a complex product summer, wherein the Radix-3 hardware block reduces nine complex-multiplications into four multiplications, wherein the Radix-3 hardware block uses arithmetic shifts, pre-computes scalers in fixed point, and negates for math optimizations.

15. A non-transitory computer-readable storage medium, the computer-readable storage medium including instructions of a compiler that implements a non-power of two Fast Fourier Transform (FFT) algorithm using a recursive function that, when executed by a processing device, cause the processing device to:

receive input specifying a sequence of indexes and a bit width of a fixed-point digital signal processor (DSP);

perform a process that splits the sequence using a recursive loop, wherein the recursive loop determines a number of multiplications in a hardware design of a plurality of compute blocks of the fixed-point DSP, determines a number of FFT points, identifies operations for serialization at a first rate that is greater than a channel rate of the fixed-point DSP, and identifies operations for math optimizations, and generates a trace graph of the non-power of two FFT algorithm corresponding to an addressing scheme of a hardware design of a plurality of compute blocks of the fixed-point DSP, wherein the process uses the recursive function and ends when the recursive loop decrements to a value corresponding to a Radix-3 or Radix-2; and output data comprising at least the number of multiplications in the hardware design, the number of FFT points, and the trace graph.

16. The computer-readable storage medium of claim 15, wherein the process is a decimation-in-time FFT (DITFFT) process or a decimation-in-frequency FFT (DIFFFT) process.

17. The computer-readable storage medium of claim 15, wherein the non-power of two FFT algorithm uses resource sharing of a compute block of the plurality of compute blocks and identifies a number of multiplications of the operations for serialization to be performed at the first rate within the compute block.

18. The computer-readable storage medium of claim 15, wherein the plurality of compute blocks comprises computing butterfly nodes, wherein a computing butterfly node comprises:

a first multiplexer and a second multiplexer;

a first flip-flop coupled to an output of the first multiplexer and a second flip-flop coupled to an output of the second multiplexer;

a multiplier coupled to the first flip-flop and the second flip-flop an adder coupled to an output of the multiplier;

a third multiplexer coupled to the adder;

a third flip-flop coupled to an output of the adder, the third flip-flop being coupled to an input of the third multiplexer; and a sequencer that controls a sequence of inputs of data and twiddle factors into the first, second, and third multiplexers, wherein the first, second, and third flip-flops are clocked at a first rate that is greater than a channel rate of the fixed-point DSP.

19. The computer-readable storage medium of claim 18, wherein the multiplier and the adder are part of a multiply-accumulate (MAC) unit of the fixed-point DSP.

20. The computer-readable storage medium of claim 15, wherein each of the plurality of compute blocks comprises:

a sequence splitter;

a Radix-2 hardware block;

a Radix-3 hardware block; and a complex product summer, wherein the Radix-3 hardware block reduces nine complex-number multiplications into four multiplications, wherein the Radix-3 hardware block uses arithmetic shifts, pre-computes scalers in fixed point, and negates for math optimizations.

\* \* \* \* \*